United States Patent
Galatage et al.

(10) Patent No.: US 10,332,969 B2
(45) Date of Patent: Jun. 25, 2019

(54) NEGATIVE CAPACITANCE MATCHING IN GATE ELECTRODE STRUCTURES

(71) Applicant: GLOBALFOUNDRIES Inc., Grand Cayman (KY)

(72) Inventors: Rohit Galatage, Clifton Park, NY (US); Steven Bentley, Menands, NY (US); Puneet Harischandra Suvarna, Menands, NY (US); Zoran Krivokapic, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/167,081

(22) Filed: Oct. 22, 2018

(65) Prior Publication Data

US 2019/0115437 A1    Apr. 18, 2019

Related U.S. Application Data

(62) Division of application No. 15/784,500, filed on Oct. 16, 2017, now Pat. No. 10,141,414.

(51) Int. Cl.
*H01L 29/423* (2006.01)
*H01L 29/66* (2006.01)
(Continued)

(52) U.S. Cl.
CPC .. *H01L 29/42324* (2013.01); *H01L 21/28273* (2013.01); *H01L 21/28291* (2013.01); *H01L 29/6653* (2013.01); *H01L 29/6684* (2013.01); *H01L 29/66825* (2013.01); *H01L 29/788* (2013.01); *H01L 29/78391* (2014.09); *H01L 29/66545* (2013.01); *H01L 29/66795* (2013.01); *H01L 29/7851* (2013.01)

(58) Field of Classification Search
CPC ......... H01L 29/42324; H01L 29/66795; H01L 29/6684; H01L 29/7831; H01L 29/7851
See application file for complete search history.

(56) References Cited

U.S. PATENT DOCUMENTS

2016/0190289 A1*  6/2016  Akarvardar ........... H01L 29/785
                                                              438/283
2018/0076334 A1   3/2018  Ando et al.

OTHER PUBLICATIONS

Li et al., "Sub-60mV-Swing Negative-Capacitance FinFET without Hysteresis," IEDM15-620-23, IEEE, 2015.

* cited by examiner

*Primary Examiner* — Hoai V Pham
(74) *Attorney, Agent, or Firm* — Amerson Law Firm, PLLC

(57) ABSTRACT

A semiconductor device includes a gate electrode structure that is positioned adjacent to a channel region of a transistor element. The gate electrode structure includes a floating gate electrode portion, a negative capacitor portion, and a ferroelectric material capacitively coupling the floating gate electrode portion to the negative capacitor portion. A first conductive material is positioned between the floating gate electrode portion and the ferroelectric material, wherein a first portion of the first conductive material is embedded in and laterally surrounded by the floating gate electrode portion, and a second conductive material is positioned between the first portion of the first conductive material and the ferroelectric material, wherein the second conductive material is embedded in and laterally surrounded by a second portion of the first conductive material.

20 Claims, 18 Drawing Sheets

(51) Int. Cl.
*H01L 21/28* (2006.01)
*H01L 29/78* (2006.01)
*H01L 29/788* (2006.01)

NEGATIVE CAPACITANCE MATCHING IN GATE ELECTRODE STRUCTURES

BACKGROUND

1. Field of the Disclosure

Generally, the present disclosure relates to techniques and related semiconductor devices in which gate electrode structures may be formed on the basis of a floating gate electrode portion and an electrode portion forming a negative capacitor.

2. Description of the Related Art

Significant progress has been made over the past decades in the field of semiconductor devices, wherein, in particular, sophisticated CMOS (complementary metal oxide semiconductor) techniques may be considered as a main contributor to this development. In the CMOS technique, a large number of P-type and N-type transistor elements may be integrated into a single semiconductor chip so as to obtain, after being functionally connected to each other, highly complex functional units, such as complex control circuitry, microcontrollers, CPUs (central processing units) and the like. The significant advances in terms of performance and integration density are associated with the continuing reduction of the dimensions of transistor elements, such as the gate length of respective transistor elements.

Although the reduction of critical dimensions, in particular, the gate length of the field effect transistors, may not only contribute to reduced size of the circuit elements and, thus, promote integration density, the reduced length of a conductive channel of a field effect transistor may also result in increased switching speed, thereby allowing operation of complex integrated circuits at increased clock frequencies. On the other hand, the continuing reduction of critical feature sizes, such as the gate length of field effect transistors, is also accompanied by certain side effects that may have to be addressed in order to not unduly offset many of the advantages gained by the reduced transistor dimensions. For example, upon further reducing the length of a channel of a field effect transistor, the capability of controlling the channel from a high ohmic state into a low ohmic state, and vice versa, may deteriorate due to a plurality of respective effects, also referred to as "short channel" effects, wherein, in particular, negative edge effects may play an increasing role with respect to overall controllability of the field effect transistor. Therefore, great efforts have been made to provide improved mechanisms that may allow superior control of semiconductor channels, even when provided with reduced length, which, in currently available advanced device generations may be 30 nm or significantly less, while three-dimensional (3-D) transistor architectures, such as FinFETs, may additionally be used so as to obtain superior channel control, wherein respective semiconductor fins may have a width of 20 nm and less.

For example, for a given gate voltage, i.e., the voltage between the gate electrode structure and the source terminal of the transistor element, the capacitive coupling between the gate electrode and the channel region and, thus, general channel controllability, may be increased by reducing the thickness of a corresponding gate dielectric material. The reduction of the thickness of a gate dielectric material is, however, limited by the material's capability to resist electrical breakthrough for the given gate voltage and also by its capability to maintain leakage currents at a moderately low level. Since standard silicon dioxide-based dielectric materials may no longer suffice for sophisticated gate electrode structures, so-called "high-k" dielectric materials are typically used, instead of or in combination with standard silicon dioxide-based dielectric materials, so as to provide high capacitive coupling at a moderate physical thickness in order to restrict leakage currents into and through the gate dielectric material. A high-k dielectric material is typically understood as a dielectric material having a dielectric constant of at least 20 under typical measurement conditions for determining dielectric characteristics of thin films. Consequently, a plurality of sophisticated manufacturing regimes have been developed in recent years in order to implement sophisticated high-k dielectric materials into the gate electrode structures of sophisticated transistor elements. For example, in some approaches for forming planar transistor elements, the high-k dielectric materials, in combination with appropriate metal-containing material layers, which may also serve for the adjustment of the work function and, thus, the threshold voltage of respective transistor elements, may be formed in an early manufacturing stage. In other approaches, these materials may be provided in a late manufacturing stage on the basis of a dummy electrode structure, which may, thus, be efficiently used to form the basis configuration of the respective transistor elements and for the subsequent formation of the gate electrode structure in a late manufacturing stage prior to forming contact elements.

A further tendency in modern integrated circuits is the demand for reduced operating voltages, since a reduced operating voltage may typically result in reduced power consumption due to a reduction of static leakage currents and the like. Moreover, a reduced operating voltage may be further advantageous with respect to the connection to an external power source, in particular, for battery-powered devices and the like. On the other hand, for a given physical thickness of a sophisticated dielectric material in a gate electrode structure, a respective reduction of the supply voltage, and thus the gate voltage, may result in reduced switching speed and reduced on-current, which may contribute to reduced overall performance. Consequently, although a reduction of supply voltage may be considered basically advantageous in view of power consumption, there may be a compromise between the power consumption and performance of a transistor.

As is well known, the threshold voltage of a transistor element indicates the gate voltage that is necessary for "filling" (for an enhancement type transistor) or for "emptying" (for a depletion mode transistor) the depletion region in the channel area of the respective transistor element. For highly scaled transistors, however, the threshold voltage may no longer be well-controlled, since a significant current flow may also take place even when the gate voltage is below the threshold voltage. Typically, a sub-threshold current is observed, which fundamentally has an exponential relationship to the gate voltage; in order to minimize leakage, it is desirable to maximize the response of the drain current to gate voltage in the sub-threshold region. Consequently, this sub-threshold swing represents a basic criterion for estimating the performance of a transistor. It should further be noted that, in conventional MOSFETs, the sub-threshold slope has a fundamental thermodynamic minimum value which cannot be further reduced.

Recent developments in high-k dielectric materials have shown that some high-k materials may also exhibit ferroelectric characteristics. In addition to the many other applications of a ferroelectric material, such as non-volatile memory, ferroelectric materials may also exhibit negative capacitance characteristics. When integrated in a transistor gate electrode, overall transistor performance may be enhanced due to improvements in drive current and sub-threshold slope originating in internal voltage gain at the intrinsic gate capacitor as a result of the negative capacitor integration. Particularly, this internal voltage gain phenomenon may allow the fundamental thermal limit in sub-threshold slope to be overcome.

In MOSFETs, the gate electrode structure may be generally understood as a MOS capacitor having a first electrode in the form of the gate metal and a second electrode formed by the free charge carriers in the inversion layer of the channel, while the thickness and material composition of the gate dielectrics substantially determine the effective capacitance for a given geometric configuration of the gate electrode structure. Consequently, when applying an appropriate voltage to the gate electrode, charge accumulation occurs in the channel region for an enhancement type transistor, wherein this effect is determined by the intrinsic capacitance of the gate.

As discussed, reduced supply voltage is desirable to reduce power consumption.

Therefore, it has been proposed to add a negative capacitance in series with the gate dielectric capacitor so as to obtain a series combination of the negative capacitance and positive gate capacitance. A capacitive divider is formed between the positive and negative capacitors, such that, under a specific set of positive and negative capacitance values, the voltage across the intrinsic dielectric positive capacitor can be higher than the voltage applied to the complete gate electrode. This voltage gain strongly depends on the configuration of the series connection of negative capacitance and positive capacitance, and the relative values of positive to negative capacitances. Therefore, to implement a negative capacitance in the gate electrode structure, it has been proposed to form a ferroelectric material on top of the classic gate dielectric or gate electrode, wherein the material characteristics and thicknesses of both capacitor layers, in combination with the overall geometric configuration, strongly affect the observed internal voltage gain effect.

For example, in Li et al., "*Sub-60 mV-swing Negative-Capacitance FinFET without Hysteresis*," IEDM 15:620-623, IEEE 2015, a FinFET transistor and related manufacturing technique are described, in which a negative capacitor is connected in series to a floating gate electrode structure. When including the negative capacitor in the circuit, the observed sub-threshold swing is significantly improved over the case where the voltage is applied directly to the floating gate electrode. It is further shown that an on-current versus gate voltage hysteresis may be avoided by appropriately selecting the value of the negative capacitance. Although this indicates significant improvements are possible with respect to overall transistor performance, such as a reduction of sub-threshold swing, on-current and the like, nevertheless, as previously described, appropriate matching of the total negative capacitance with respect to the total positive gate capacitance is an important, yet non-addressed, aspect for obtaining overall superior transistor performance.

In particular, matching negative capacitance to positive capacitance with respect to a typical gate electrode structure, which may then be used as a floating gate, appears to be a very challenging task, since the dielectric constant of typical ferroelectric materials is high, while the available space in modern CMOS gate integration is highly constrained, requiring very thin films to fit in a scaled gate electrode. As a result, simple integration schemes result in undesirable capacitance ratios in order to achieve the desired internal voltage gain for performance enhancement.

In view of the situation described above, the present disclosure relates to fabrication techniques for a semiconductor device in which a negative capacitor may be implemented in a gate electrode structure, while avoiding or at least reducing the effects of one or more of the problems identified above.

SUMMARY

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is based on a concept that significant improvements in transistor performance may be achieved by incorporating a negative capacitor into a gate electrode structure. That is, it has been previously shown that significant improvements in on-current and sub-threshold swing may be achieved, however, appropriate matching of the negative gate capacitance to the positive gate dielectric capacitance is critical. In this respect, it has been recognized that, for sophisticated technology nodes, efficient mechanisms for adjusting the desired negative capacitance to improve matching may be accomplished by adjustment of the effective thickness of the dielectric of the negative capacitor and the resulting effective area of the negative capacitance, without compromising on the overall scalability of the transistor.

In some illustrative embodiments disclosed herein, incorporation of the negative capacitance into a gate electrode structure may be efficiently implemented in a replacement gate manufacturing approach, in which a recess for providing an appropriate high-k and metal gate may be formed in a late manufacturing stage, and which may be further recessed to provide a protective cap material for self-aligned contacts. In this manner, the respective recess or opening may also be employed to incorporate a dielectric material having ferroelectric characteristics above an existing high-k metal gate structure, while the underlying gate electrode structure may thus be formed into a floating gate structure that is capacitively coupled to an upper metal electrode through the overlying negative capacitance. The final characteristics of this system may be advantageously adjusted on the basis of at least two different mechanisms during the formation of the negative capacitor.

One illustrative semiconductor device disclosed herein includes a gate electrode structure that is positioned adjacent to a channel region of a transistor element. The gate electrode structure includes, among other things, a floating gate electrode portion, a negative capacitor portion, and a ferroelectric material that capacitively couples the floating gate electrode portion to the negative capacitor portion. The illustrative gate electrode structure further includes a first conductive material that is positioned between the floating gate electrode portion and the ferroelectric material, wherein a first portion of the first conductive material is embedded in and laterally surrounded by the floating gate electrode portion, and a second conductive material that is positioned between the first portion of the first conductive material and the ferroelectric material, wherein the second conductive material is embedded in and laterally surrounded by a second portion of the first conductive material.

In another exemplary embodiment, a semiconductor device is disclosed that includes a gate electrode structure positioned adjacent to a channel region of a transistor element, and the gate electrode structure includes, among other things, a floating gate electrode portion, a negative capacitor portion that includes a first conductive material and a second conductive material that is different from the first conductive material, wherein the second conductive material is embedded in and laterally surrounded by the first conductive material, and a ferroelectric material capacitively coupling the floating gate electrode portion to the negative capacitor portion, wherein at least a portion of the ferroelectric material is laterally surrounded by a dielectric spacer. The gate electrode structure further includes a third conductive material positioned between the floating gate electrode portion and the ferroelectric material, wherein a first portion of the third conductive material is embedded in and laterally surrounded by the floating gate electrode portion, and a fourth conductive material positioned between the first portion of the third conductive material and the ferroelectric material, wherein the fourth conductive material is embedded in and laterally surrounded by a second portion of the third conductive material, the fourth conductive material being different from the third conductive material.

According to a further illustrative embodiment disclosed herein, a semiconductor device includes a gate electrode structure positioned adjacent to a channel region of a transistor element, the gate electrode structure including a floating gate electrode portion, a negative capacitor portion comprising a first conductive material and a second conductive material, wherein the second conductive material is embedded in and laterally surrounded by a first portion of the first conductive material, and a ferroelectric material that capacitively couples the floating gate electrode portion to the negative capacitor portion, wherein the first conductive material is embedded in and laterally surrounded by the ferroelectric material. The exemplary gate electrode structure also includes a third conductive material positioned between the floating gate electrode portion and the ferroelectric material, wherein a first portion of the third conductive material is embedded in and laterally surrounded by the floating gate electrode portion, and wherein a lower portion of the ferroelectric material is embedded in and laterally surrounded by a second portion of the third conductive material. Additionally, the gate electrode structure further includes a fourth conductive material that is positioned between the first portion of the third conductive material and the ferroelectric material, wherein the fourth conductive material is embedded in and laterally surrounded by a third portion of the third conductive material, the third portion of the third conductive material further covering an upper surface of the fourth conductive material. Furthermore, the illustrative semiconductor device also includes a dielectric sidewall spacer that is positioned adjacent to sidewalls of the gate electrode structure, wherein the dielectric sidewall spacer laterally surrounds an upper portion of the ferroelectric material, the second and third portions of the third conductive material, and the floating gate electrode portion.

BRIEF DESCRIPTION OF THE DRAWINGS

The disclosure may be understood by reference to the following description taken in conjunction with the accompanying drawings, in which like reference numerals identify like elements, and in which.

Figure 1A:
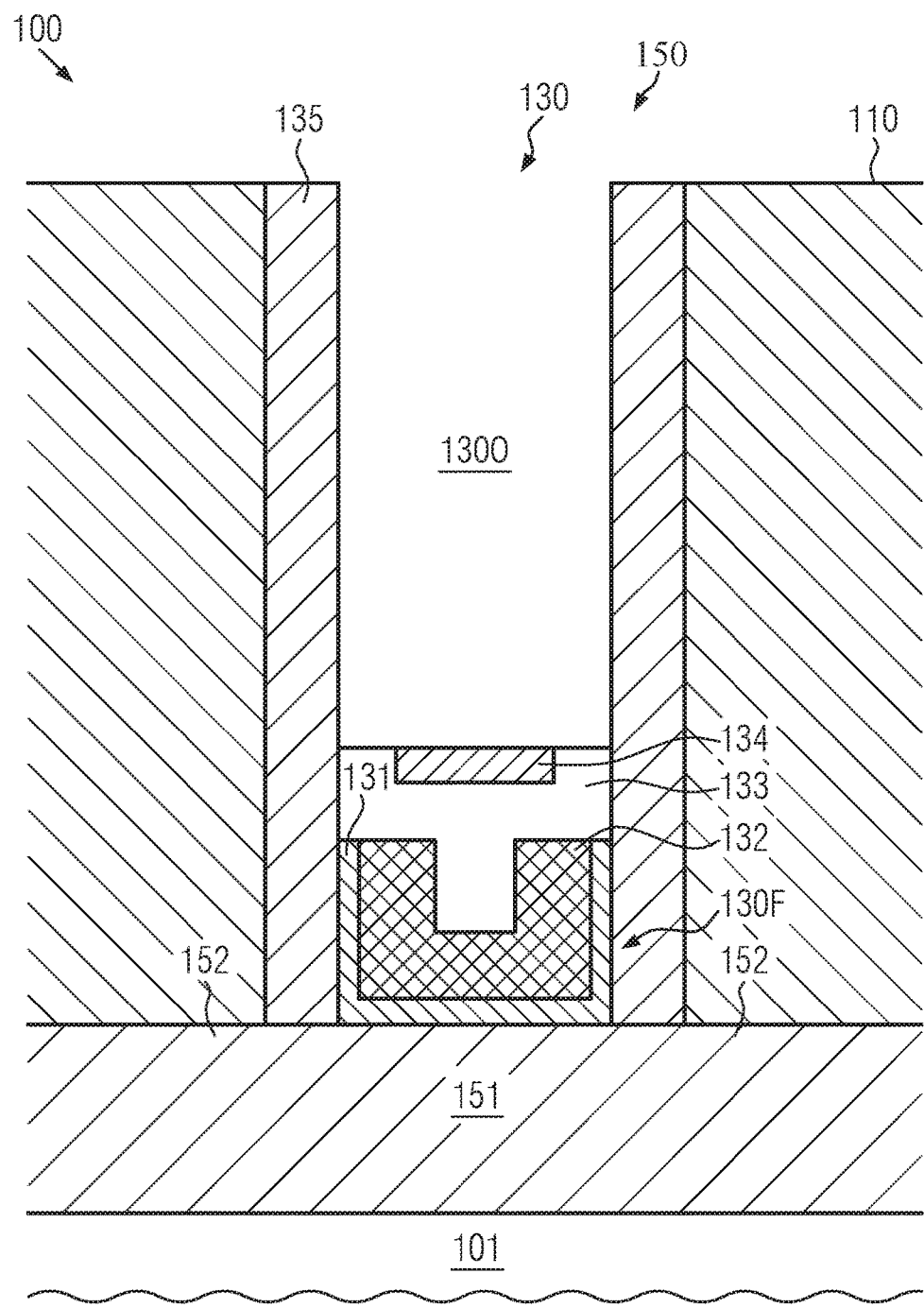
FIGS. 1A-1G schematically illustrate cross-sectional views of a semiconductor device during various manufacturing stages in forming a gate electrode structure including a negative capacitor portion and a floating gate portion on the basis of an opening and a dielectric spacer element for adjusting the negative capacitance value, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the subject matter defined by the appended claims to the particular forms disclosed, but on the contrary, the intention is to cover all modifications, equivalents, and alternatives falling within the spirit and scope of the claimed subject matter.

DETAILED DESCRIPTION

In the following description, specific details may be set forth for purposes of explanation in order to provide a thorough understanding of certain exemplary embodiments. It should be apparent, however, that exemplary embodiments may be practiced without these specific details or with an equivalent arrangement. In other instances, well-known structures and devices may be shown in block diagram form in order to avoid unnecessarily obscuring exemplary embodiments. In addition, unless otherwise indicated all numbers expressing quantities, ratios, and/or numerical properties of ingredients, reaction conditions, and so forth as used in the specification and the appended claims are to be understood as being modified in all instances by the term "about."

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used in this description and in the appended claims, the terms "substantial" or "substantially" are intended to conform to the ordinary dictionary definition of that term, meaning "largely but not wholly that which is specified." As such, no geometrical or mathematical precision is intended by the use of terms such as "substantially flat," "substantially perpendicular," "substantially parallel," "substantially circular," "substantially elliptical," "substantially rectangular," "substantially square," "substantially aligned," and/or "substantially flush," and the like. Instead, the terms "substantial" or "substantially" are used in the sense that the described or claimed component or surface configuration, position, or orientation is intended to be manufactured, positioned, or oriented in such a configuration as a target. For example, the terms "substantial" or "substantially" should be interpreted to include components and surfaces that are manufactured, positioned, or oriented as close as is reasonably and customarily practicable within normally accepted tolerances for components of the type that are described and/or claimed. Furthermore, the use of phrases such as "substantially conform" or "substantially conforms" when describing the configuration or shape of a particular component or surface, such as by stating that "the configuration of the component substantially conforms to the configuration of a rectangular prism," should be interpreted in similar fashion.

Furthermore, it should be understood that, unless otherwise specifically indicated, any relative positional or directional terms that may be used in the descriptions set forth below—such as "upper," "lower," "above," "below," "over," "under," "top," "bottom," "vertical," "horizontal," "lateral," and the like—have been included so as to provide additional clarity to the description, and should be construed in light of that term's normal and everyday meaning relative to the depiction of the components or elements in the referenced figures. For example, referring to the cross-sectional view of the semiconductor device 100 depicted in FIG. 1G, it should be understood that the channel region 151 is depicted as being positioned "below" the floating gate portion 130F, and the work-function adjusting material 132 of the floating gate portion 130F is depicted as being positioned "above" the bottom layer portion of the gate dielectric layer 131 and "below" the conductive electrode material 133. Additionally, the "top" or "upper" surfaces conductive electrode materials 133 and 134 as shown in FIG. 1G are depicted as being substantially "horizontally" oriented, and the conductive electrode material 133 is shown as extending "below" the "bottom" or "lower" surface of the dielectric sidewall spacer elements 136. However, it should be understood that such descriptions are for reference only based on how the various elements are arranged relative to one another in the figures, and therefore should not be construed as limiting in any way on how the depicted structures or components might actually be oriented during manufacture, assembly, and/or use.

In illustrative embodiments of the present disclosure, a concept has been implemented according to which a gate electrode structure of a transistor element may be formed on the basis of a floating gate electrode portion formed on the basis of a geometric configuration and a material compatible to a specific device generation or technology node, while, additionally, a negative capacitance may be incorporated into the gate electrode structure on the basis of process techniques that enable appropriate adaptation or matching of the characteristics of the negative capacitance to the floating gate electrode portion. It has been recognized that, in particular, the layer thickness of a dielectric material having ferroelectric characteristics and the effective capacitive area of such a dielectric material may provide efficient mechanisms for specifically adjusting the finally obtained negative capacitance and, thus, the possibility of finely tuning the overall performance of the gate electrode structure. As discussed above, appropriate fine tuning or matching of a negative capacitance may result in superior performance, for instance, with respect to avoiding hysteresis behavior and achieving high on-current and reduced sub-threshold swing of 60 mV/decade, and significantly less.

On the other hand, a high degree of compatibility with existing process techniques may be preserved so as to not unduly contribute to overall manufacturing costs. In this respect, it has been recognized that a process regime in which an electrode material of a gate electrode structure may be recessed in a late manufacturing stage, for instance, for incorporating an appropriate dielectric material for a self-aligned contact process technique, may be advantageously used as a starting point for forming the negative capacitance above the previously established gate electrode structure, thereby forming the previously established gate electrode structure into a floating gate electrode portion that is capacitively coupled to the overlying negative capacitor. At the same time, various process techniques, such as well-established deposition techniques and highly compatible materials, may be used so as to provide superior process control in adjusting the effective thickness of the dielectric material, which, in illustrative embodiments, may be a ferroelectric material or may have ferroelectric characteristics, of the negative capacitance and its capacitive area.

When implementing the process regime, strategies have been identified in which at least two different processes may be applied so as to adjust the desired characteristics of the negative capacitance, such as the deposition of a dielectric or conductive spacer material with well-defined thickness and the deposition of the dielectric material with ferroelectric characteristics on the basis of various deposition regimes so as to also independently adjust the effective capacitive thickness thereof.

FIG. 1A schematically illustrates a cross-sectional view of a semiconductor device 100 in a moderately advanced manufacturing stage. As shown, the semiconductor device 100 may comprise a transistor element 150, such as a P-type transistor or an N-type transistor, wherein it is to be understood that, typically, both types of transistor elements may be present in the semiconductor device 100 depending on the overall circuit configuration. It should be appreciated that the concept of the present disclosure may be readily applied to any type of transistor element.

The transistor element 150 may comprise a gate electrode structure 130 formed above a respective channel region 151, which may represent a semiconductor region of appropriate characteristics so as to serve as the channel of the transistor element 150 upon applying an appropriate potential, which may, thus, act on charge carriers in the channel region 151, as also previously discussed. In some illustrative embodiments, the channel region 151 may be formed on the basis of crystalline semiconductor materials, such as silicon, germanium, silicon/germanium and the like, wherein, in other illustrative embodiments, other semiconductor materials, including III-V and/or II-VI semiconductor compounds, may also be used. Furthermore, in the embodiment shown in FIG. 1A, it may be assumed that the channel region 151 may be formed of a basically crystalline semiconductor material, while, in other concepts, substantially amorphous or microcrystalline semiconductor materials may also be used. The transistor element 150 may further comprise drain and source regions 152, which may have any appropriate configuration, i.e., these materials may be provided in the form of a highly doped crystalline semiconductor material, highly doped amorphous material, possibly in combination with metal-containing semiconductor compounds for reducing overall contact resistance, and the like. In other cases, the drain and source regions 152 may be provided in the form of a raised or recessed geometry, in which a highly doped semiconductor material may be formed on a semiconductor layer that represents the semiconductor base material of the channel region 151. It should be generally appreciated that any appropriate geometry or architecture may be used for the transistor element 150, wherein, in particular, a thickness of the channel region may be selected in accordance with device requirements. For instance, a substantially depleted device architecture may be frequently implemented by providing the semiconductor material below the gate electrode structure 130 with reduced thickness, for instance, of approximately 15 nm and significantly less, while, in other cases, a corresponding substantially depleted configuration may not be required. Similarly, an appropriate substrate material 101 may be provided, which may include any appropriate carrier material, such as a crystalline semiconductor material in the form of silicon, germanium, silicon/germanium and the like, with appropriate doped regions, if required, for the overall configuration of the semiconductor device 100. In other cases, a buried insulating layer (not shown) may be provided in the substrate material 101 so as to define an SOI (semiconductor- or silicon-on-insulator) architecture, at least in some areas of the semiconductor device 100.

It should be further appreciated that, in some illustrative embodiments, the transistor element 150 may represent a planar transistor configuration, i.e., the current flow direction in the channel region 151 may extend in a substantially single direction, i.e., in FIG. 1A, the horizontal direction, without significant changes of the current flow direction as is typically the case in 3-D transistor architectures, such as FinFET structures and the like. In other embodiments, the transistor element 150 may represent a 3-D transistor having a fin or gate-all-around configuration, hence the gate structure shown has topography into the plane of the figure. Further, in other embodiments, the transistor element 150 may represent a vertically oriented transistor such that the gate and channel elements shown have additional topography beyond the simple case shown. In still further embodiments, it should be understood that the transistor elements defined may be further integrated in a substantially 3-D or stacked architecture having multiple layers of active transistor elements such as structure 150.

In this manufacturing stage, the transistor element 150 may be embedded in one or more appropriate dielectric materials of a contact level 110, for instance, provided in the form of silicon nitride, silicon dioxide and the like. Consequently, the transistor element 150 may be passivated by the dielectric material of the contact level 110 and may further provide a device level in which contact elements may have to be formed in a later manufacturing stage so as to connect to respective areas of the transistor element 150 and provide contact to a metallization system (not shown) to be formed above the contact level 110.

Moreover, in this manufacturing stage, the gate electrode structure 130 may comprise an opening 130O formed in a portion of the structure 130 so as to extend down to a specified depth, thereby exposing conductive electrode materials 133 and 134 of the gate electrode structure 130. That is, a sidewall spacer 135 formed of a robust dielectric material, such as silicon nitride, low-k materials and the like, may still be present and may laterally passivate the gate electrode structure 130 and may, thus, reliably cover sidewall portions of remaining materials of the gate electrode structure 130. As will be discussed later in more detail, the remaining portion of the gate electrode structure 130, after having formed the opening 130O, may also be referred to as a floating gate electrode portion 130F, since the portion 130F may not have direct contact to any reference voltage used for controlling the channel region 151 during operation of the transistor element 150.

The floating gate electrode portion 130F may comprise a dielectric material, also referred to as gate dielectric material 131, which, in sophisticated applications, may be provided in the form of a high-k dielectric material, such as hafnium oxide-based material, zirconium oxide-based material and the like. It should be appreciated that a plurality of dielectric materials may be used in forming sophisticated gate electrode structures requiring superior capacitive coupling to the channel region 151. Hence, any such high-k dielectric materials may be used for the layer 131. It should be appreciated that, in some illustrative embodiments, an additional "conventional" dielectric material, such as silicon dioxide, silicon oxynitride and the like, may be used, at least at an interface formed between the channel region 151 and the dielectric layer 131. If such a conventional dielectric material may be required, the thickness may be selected so as to have low influence on the total capacitance of the dielectric material 131. Furthermore, a further material layer 132, which may be formed so as to allow adjustment of threshold characteristics of the transistor element 150, may be provided and may act as a work function-adjusting material layer, which may represent any material that is appropriate for adjusting the basic threshold voltage for transistor element 150. For instance, aluminum, possibly in combination with other metal species, such as TiAlC, TiAlN, NbAlC, may be provided, while, in other cases, any other appropriate metal species, such as TiN, TaN, TiON, may be incorporated into the layer 132. Moreover, the electrode material 133, which may also act as an efficient barrier material layer, and the material 134 may represent actual electrode materials, wherein, in particular, the material 134 may provide reduced overall resistance and may be provided in the form of tungsten, cobalt and the like, while the barrier material 133 may be provided in the form of TiN, TaN and the like.

It should be appreciated that the materials of the gate electrode structure 130 may be formed in a late manufacturing stage, i.e., after removing any dummy material of a dummy structure used for fabricating the transistor element 150 and after depositing the one or more dielectric materials of the contact level 110. Consequently, after removing any non-required dummy materials, the material system of the gate electrode structure 130 may be formed on the basis of well-established deposition techniques, thereby also forming the materials 131, 132 and 133 also on sidewalls of the respective opening obtained after removing any non-required dummy materials, while still preserving the sidewall spacers 135. In other cases, at least some of the materials required for the gate electrode structure 130 may be formed in an early manufacturing stage and a portion thereof may be removed upon forming the opening 130O.

Generally, a process strategy for forming the semiconductor device 100 as illustrated in FIG. 1A may include the following processes.

As discussed above, in some illustrative embodiments, the gate electrode structure 130, including at least a specific gate dielectric material, such as the material 131, a work function-adjusting material, such as the material 132, and an electrode material, such as the material 133, may be formed in an early manufacturing stage, i.e., after defining appropriate active regions on the basis of appropriate isolation structures (not shown) and preparing doped regions in the substrate material 101 and/or in the semiconductor material used for forming the channel region 151 and the drain and source regions 152. As indicated above, depending on the overall transistor configuration, appropriate and well-established process regimes may be applied, for instance, for forming fully depleted channel regions for any type of transistors required in the semiconductor device 100, while respective gate electrode structures may be formed on the basis of appropriate dielectric and conductive materials, wherein the gate electrode structure 130 may be provided as a functional structure in an early manufacturing stage.

In other cases, a dummy structure may be provided, at least for some transistor elements, such as the transistor element 150. In some illustrative embodiments, the gate electrode structure 130 or its counterpart dummy structure may be formed on the basis of a channel length of 30 nm and significantly less, when sophisticated semiconductor devices 100 are considered. In other embodiments, the gate length may be significantly longer. The further processing may be continued by performing any appropriate processes, such as implantation processes, selective epitaxial growth processes, anneal processes and the like, as required for obtaining the desired device characteristics. In a further advanced manufacturing stage, the one or more dielectric materials for the contact level 110 may be deposited by well-established process techniques, followed by planarization processes, which may be followed by a masking and etching regime so as to remove a portion of the materials of the gate electrode structure 130, thereby forming the opening 130O, while, in other cases, a corresponding dummy structure may be substantially completely removed on the basis of the sidewall spacers 135 and a corresponding masking regime, followed by the deposition of the materials 131, 132, 133 and 134.

As discussed above, formation of the high-k dielectric material 131 may be accompanied by depositing or forming by oxidation or other surface treatments a conventional dielectric material (not shown). The materials 131, 132, 133 and 134 when provided in this late manufacturing stage may be deposited on the basis of well-established deposition techniques. For instance, high-k dielectric materials, such as hafnium oxide, may be deposited by ALD (atomic layer deposition) or other sophisticated CVD (chemical vapor deposition) techniques. Also, the work function material 132 and the barrier material 133 may be formed by ALD, PVD (physical vapor deposition), metal-organic CVD, and the like. After depositing the electrode material 134 and planarizing the resulting surface topography, the further processing may be continued by forming an etch mask and selectively removing a portion of the materials 134 and 133 with respect to the sidewall spacers 135, thereby obtaining the floating gate electrode portion 130F as shown in FIG. 1A. It should be appreciated that respective removal processes for removing the metal-containing materials 133 and 134 are well established in the art, since, in some well-established process regimes, these materials may have to be recessed anyway in order to provide a corresponding opening for forming therein a dielectric cap material for a subsequent self-aligned etch process for forming contact elements connecting to the gate electrode structure 130.

Figure 1B:
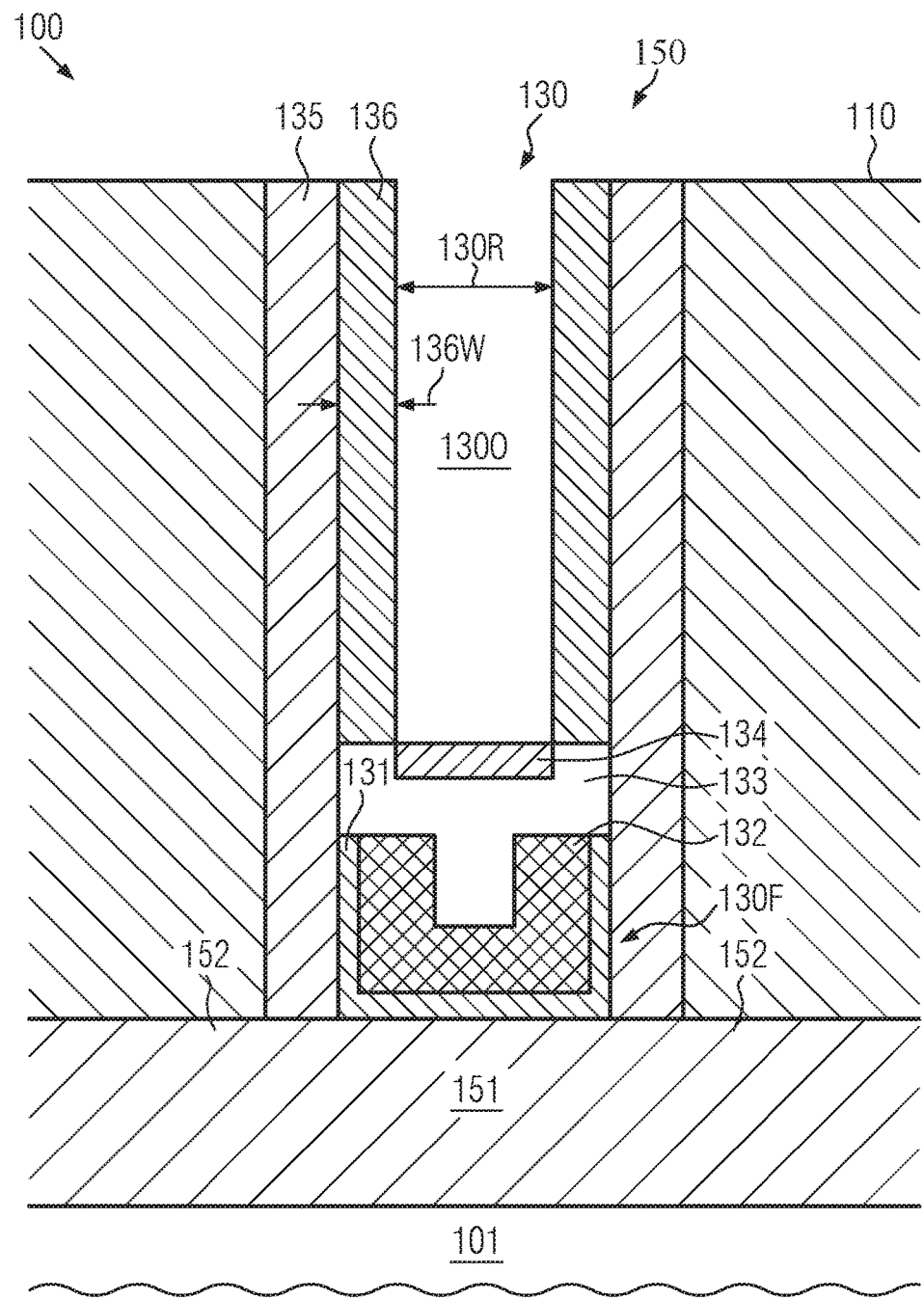

FIG. 1B schematically illustrates the semiconductor device 100 in a further advanced manufacturing stage in which a width of the opening 130O may be reduced, as indicated by 130R, which may be accomplished by providing dielectric sidewall spacer elements 136 of specified width or thickness 136W on sidewalls of the opening 130O. The sidewall spacers 136 may be provided in the form of any appropriate dielectric material that provides the required deposition capabilities and compatibility during the subsequent processing, i.e., etch resistivity and the like. For example, in some illustrative embodiments, the sidewall spacers 136 may be provided in the form of a hafnium dioxide material. Other candidates for forming the spacers 136 may include materials such as silicon dioxide, SiN, SiBCN, SiOCN and the like.

The sidewall spacers 136 may be formed in accordance with well-established deposition and etch strategies, wherein a layer of material may be deposited so as to appropriately select the width or thickness 136W. To this end, well-established, highly conformal deposition techniques, such as ALD or plasma-enhanced CVD techniques, are available and may be used for forming a corresponding conformal layer of the material of the spacer elements 136. It should be appreciated that hafnium dioxide or any of the above-identified materials are well-established high-k dielectric materials, which may also be used as a gate dielectric material, for instance, for the layer 131 and, hence, the respective deposition techniques and etch recipes are also well established. Thereafter, anisotropic etch recipes may be applied so as to remove the material from any horizontal portions, in particular, from the bottom of the opening 130O, thereby re-exposing at least the material 134. It should be appreciated that additional cleaning recipes may be applied, if required, which are also well established in the art.

Consequently, by forming the dielectric sidewall spacers 136 with appropriate thickness or width 136W, a first mechanism may be provided so as to adjust the characteristics of a negative capacitance still to be formed on the basis of a respective dielectric material of ferroelectric behavior.

Figure 1C:
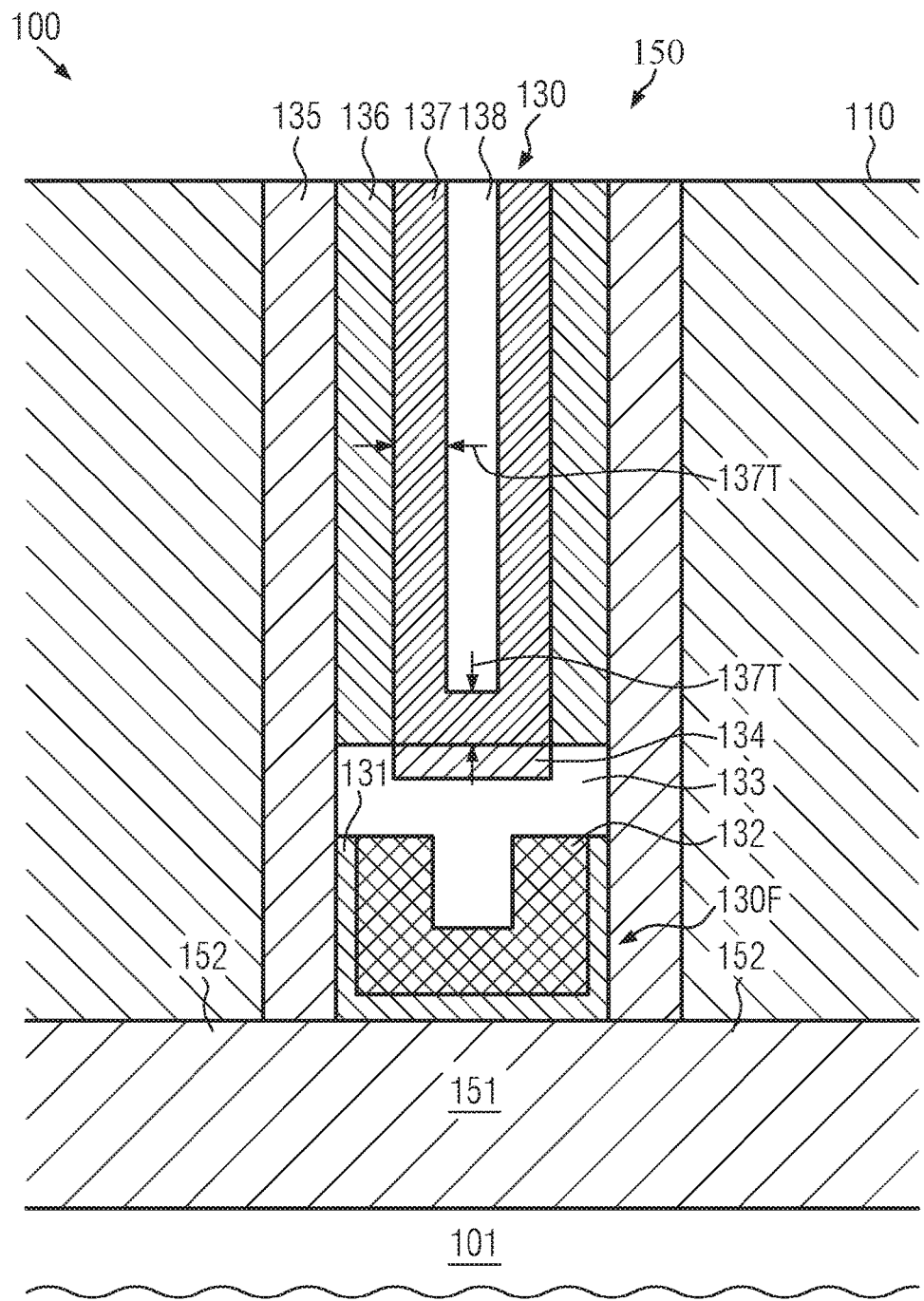

FIG. 1C schematically illustrates the semiconductor device 100 in a further advanced manufacturing stage. As illustrated, a dielectric material 137 having ferroelectric characteristics may be formed with a specified layer thickness 137T within the opening 130O (see FIG. 1B), which may be accomplished on the basis of well-established deposition recipes, such as ALD, CVD and the like. For example, the material of the layer 137 may represent a high-k dielectric material having ferroelectric capabilities when deposited and processed in a specific manner. For instance, hafnium oxide-based materials, hafnium zirconium oxide-based materials, silicon doped hafnium oxide-based materials, or silicon doped zirconium oxide-based, Al doped HfO2, Y doped HfO2, La doped HfO2, Gd doped HfO2, Sr doped HfO2 materials may represent dielectric materials exhibiting ferroelectric characteristics when formed as a thin layer and exposed to specific process conditions. It should be appreciated that, in some illustrative embodiments, the materials 136, 137 may exhibit very similar characteristics and, thus, a corresponding post-deposition treatment of the material 137 may also influence the material 136. Even if such an influence would be present, the finally obtained properties of a negative capacitance portion still to be formed on the basis of the dielectric material 137 would not be substantially affected, as long as the thickness 137T may be adjusted on the basis of a separate deposition process in order to obtain the desired thickness at the bottom of the previously formed opening 130O (see FIG. 1B). Thereafter, a metal material 138, such as titanium nitride and the like, which may also be a well-established material for forming sophisticated gate electrode structures, may be deposited so as to substantially completely fill the remaining opening, i.e., the space between the sidewall portions of the layer 137. The deposition of the material 138 may be accomplished by well-established deposition recipes followed by a planarization process, while, in other cases, a selective etch recipe may be applied.

Figure 1D:
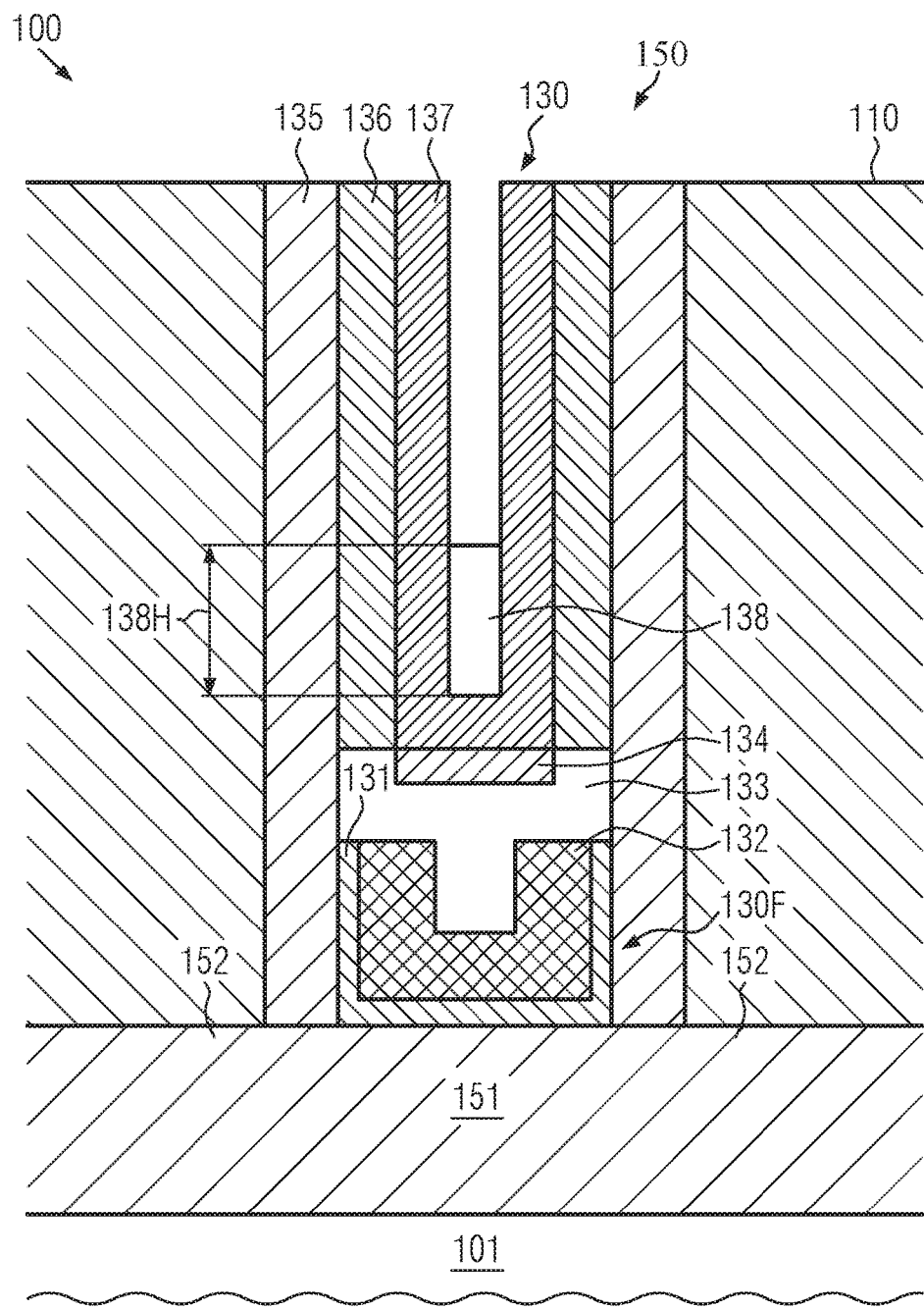

FIG. 1D schematically illustrates a cross-sectional view of the semiconductor device 100, wherein a portion of the material 138 may be removed. This may be accomplished on the basis of a selective etch recipe, wherein an etch rate for the material 138 may be significantly higher compared to the materials 137, 136, 135. It should be appreciated that any such selective etch recipes, for instance, for titanium nitride, are well established in the art and may be used for obtaining a specific height level 138H of the material 138. It should be noted that, during a corresponding etch process, any other material portions of the material 138 on horizontal device areas may be removed.

In some cases, when gate electrode structures with increased gate length are also subjected to the process sequence, additional measures may have to be taken for protecting such long-channel devices, as the etch rate may be higher during a corresponding etch process. Therefore, such devices may be masked and may be treated separately compared to the devices of moderately reduced channel length, such as the gate electrode structure 130.

It should be appreciated that, in some illustrative embodiments, after depositing the material 137, any post-deposition treatment may be applied in order to adjust certain material characteristics of the layer 137. In other illustrative embodiments, in addition to or alternative to performing a post-deposition treatment, prior to depositing the material 137, exposed surface areas of the materials receiving the material 137 may be appropriately prepared for adjusting, for instance, granularity of the material 137 after deposition, thereby also affecting the finally obtained degree of ferroelectricity.

Figure 1E:
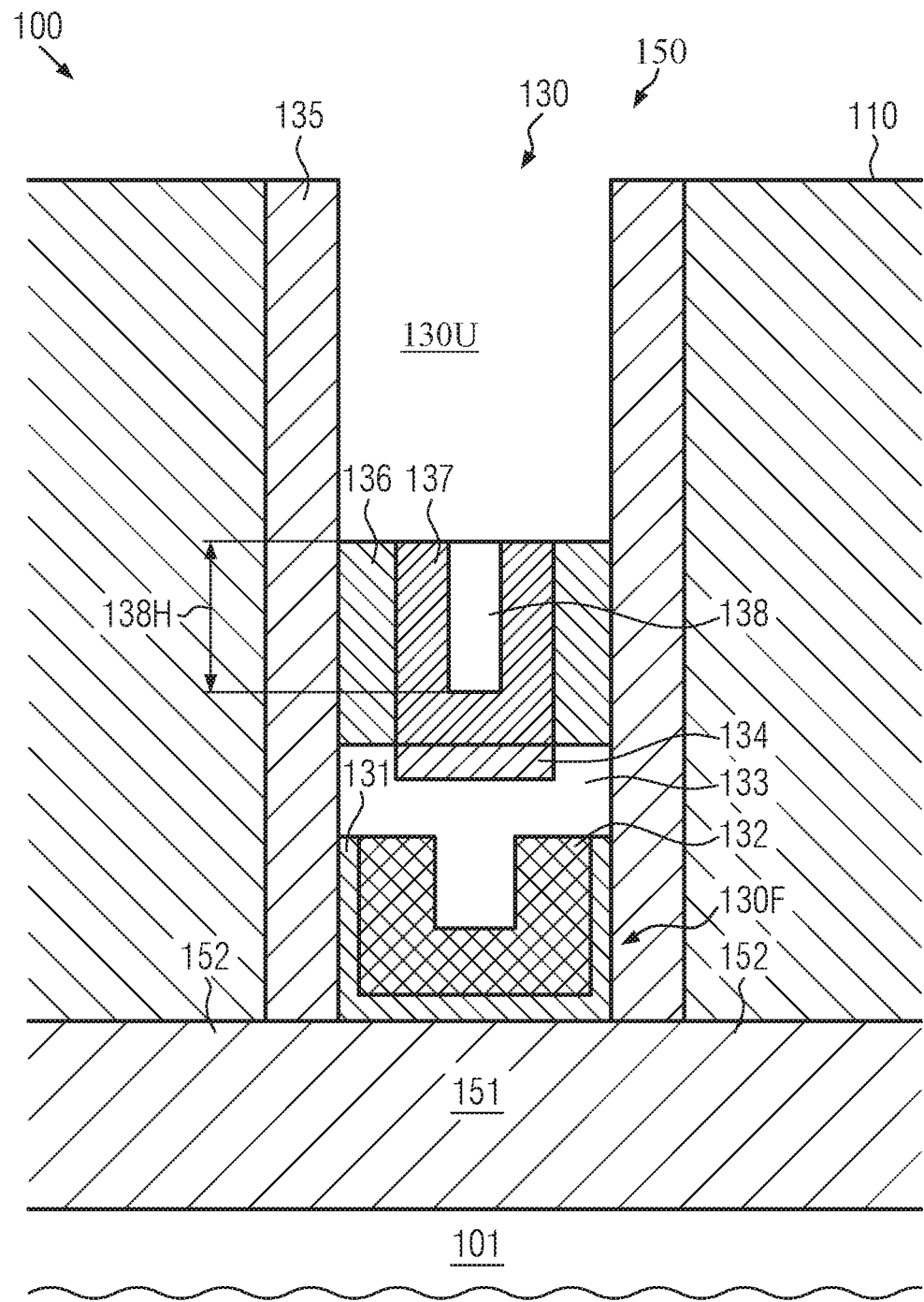

FIG. 1E schematically illustrates the semiconductor device 100 in a further advanced manufacturing stage, in which the materials 136, 137 may be selectively removed with respect to the materials 135 and 138, which may be accomplished on the basis of selective anisotropic etch recipes or isotropic etch recipes, possibly in combination with an appropriate polymer polarization layer. Consequently, the material 138 may be used for determining an appropriate end of the removal process, thereby forming the materials 136, 137 so as to substantially correspond to the height level 138H. Consequently, during the corresponding removal process, a further opening 130U may be formed, which may be subsequently used for depositing appropriate electrode materials and a dielectric cap material.

Figure 1F:
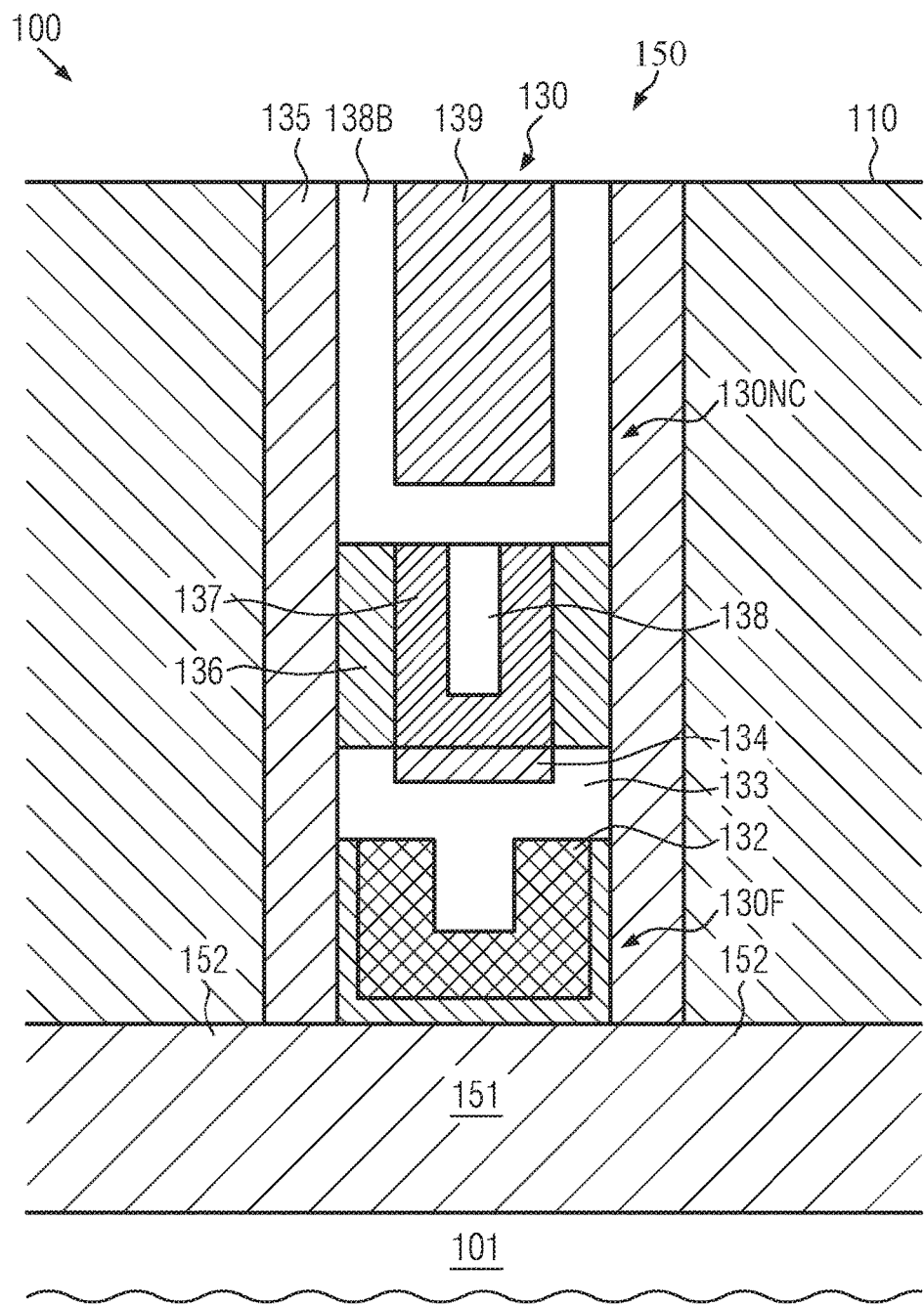
Figure 1G:
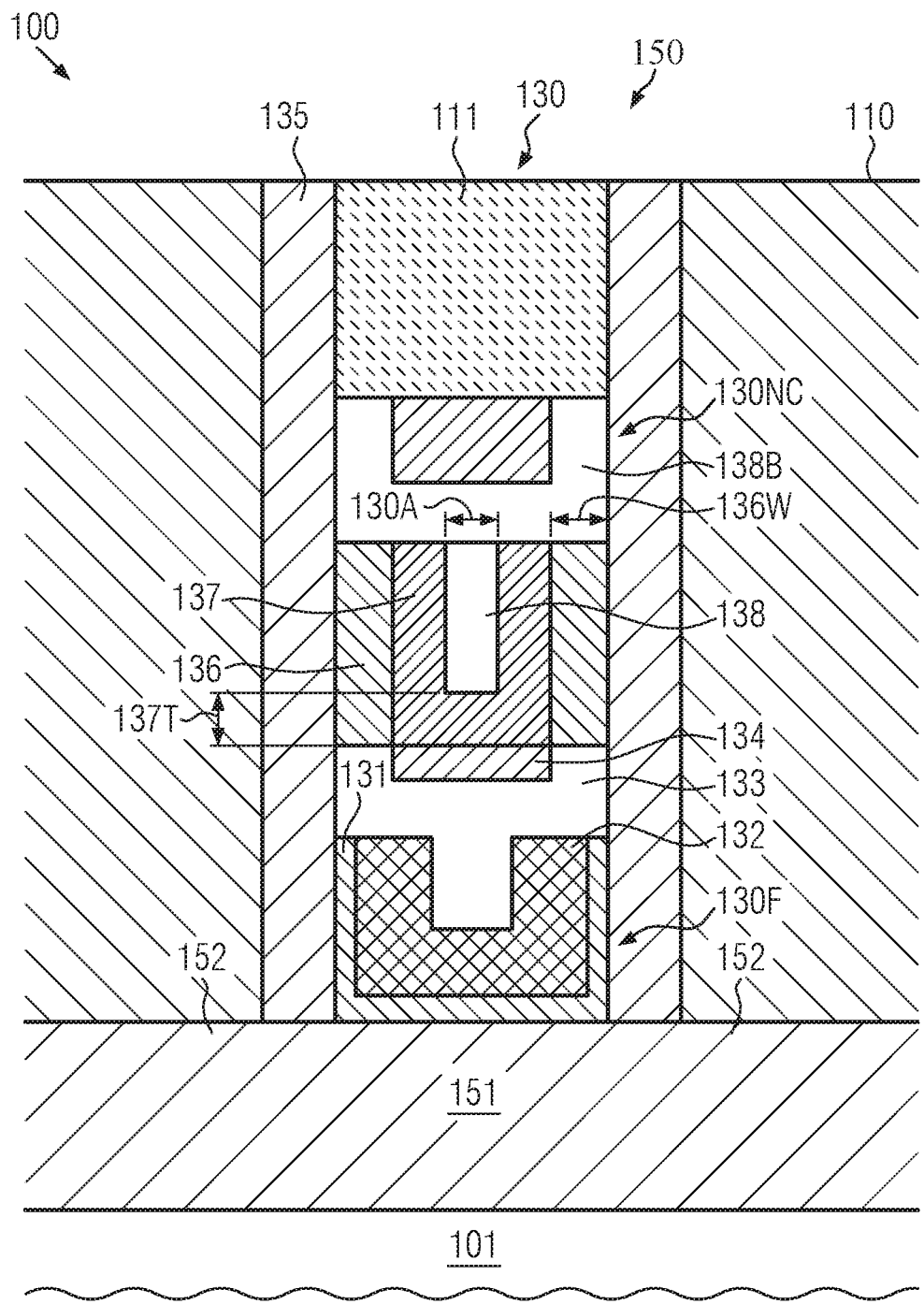

FIG. 1F schematically illustrates the semiconductor device 100 in a manufacturing stage in which a layer of conductive material 138B, which, in some illustrative embodiments, may be provided in the form of the same material as the material 138, may be formed so as to connect to the material 138. It should be appreciated, however, that any other conductive material may be used. Furthermore, a highly conductive metal material 139, such as tungsten and the like, may be formed and may act as an efficient electrode material of the gate electrode structure 130.

The materials 138B, 139 may be deposited by well-established deposition techniques, followed by a planarization process so as to provide a substantially planar surface topography for the further processing. Consequently, by means of the conductive materials 138B, 139 and 138, an electrode of a negative capacitor portion 130NC may be provided, wherein the material 137 may represent the dielectric material capacitively coupling the electrode portion 130NC to the floating gate electrode portion 130F. In order to impart ferroelectric characteristics to the material 137, at any appropriate time of the process flow an anneal process may be performed so as to crystallize the material 137. For example, a respective anneal process may be performed at the stage as shown in FIG. 1F, wherein any non-crystallized portions of the material 137 (not shown) may readily be removed from surface areas by CMP.

FIG. 1G schematically illustrates the semiconductor device 100 in a further advanced manufacturing stage in which a dielectric cap material 111 may be formed in the gate electrode structure 130, which may be accomplished by recessing the materials 138B, 139 on the basis of well-established etch recipes, followed by the deposition of an appropriate dielectric material, such as silicon dioxide, silicon nitride and the like, followed by a planarization process.

Consequently, the gate electrode structure 130 may comprise the negative capacitor portion 130NC capacitively coupled to the floating electrode portion 130F, wherein the negative capacitance of the portion 130NC, for a given composition of the material 137 and previously performed treatment, i.e., annealing, may be defined by the thickness 137T of the bottom portion of the material 137 and by the effective capacitive area that is defined by the dimension 130A. On the other hand, for a desired thickness 137T of the bottom portion of the material 137 and its effective capacitive area, selecting a material composition, such as an amount of doping of a hafnium oxide based material, and its treatment would result in the desired capacitance matching. That is, adjustment of the negative capacitance may be accomplished on the basis of two different mechanisms, i.e., the deposition of the layer 137 having the specified thickness 137T for given material characteristics, while, on the other hand, the dimension 130A and, thus, the effective capacitive area of the portion 130NC, may be defined on the basis of the thickness or width 136W of the spacers 136. It should be appreciated that the dimension 130A may, in principle, also depend on the thickness 137T. It is to be noted, however, that, after selecting a target thickness 137T, the dimension 130A may still be independently adjusted by appropriately determining a target width 136W of the sidewall spacers 136. Consequently, two efficient mechanisms with well-predictable and repeatable process results may allow an appropriate fine-tuning of the capacitance value of the negative capacitance portion 130NC for a given configuration of the floating gate electrode portion 130F. Therefore, a desired matching of these electrode portions may be implemented on the basis of substantially independent and well-controllable manufacturing processes, wherein a high degree of compatibility with well-established process techniques may additionally still be preserved. Consequently, for an otherwise given transistor configuration, significant performance improvement with respect to reduced sub-threshold swing and increased on-current may be achieved for a given supply voltage, while, in other cases, the supply voltage may be reduced while preserving a required operational behavior of the transistor element 150.

With reference to FIGS. 2A-2F, further semiconductor devices and techniques will be described in order to provide a gate electrode structure including a negative capacitance that may be finely tuned on the basis of at least two different manufacturing processes.

Figure 2A:
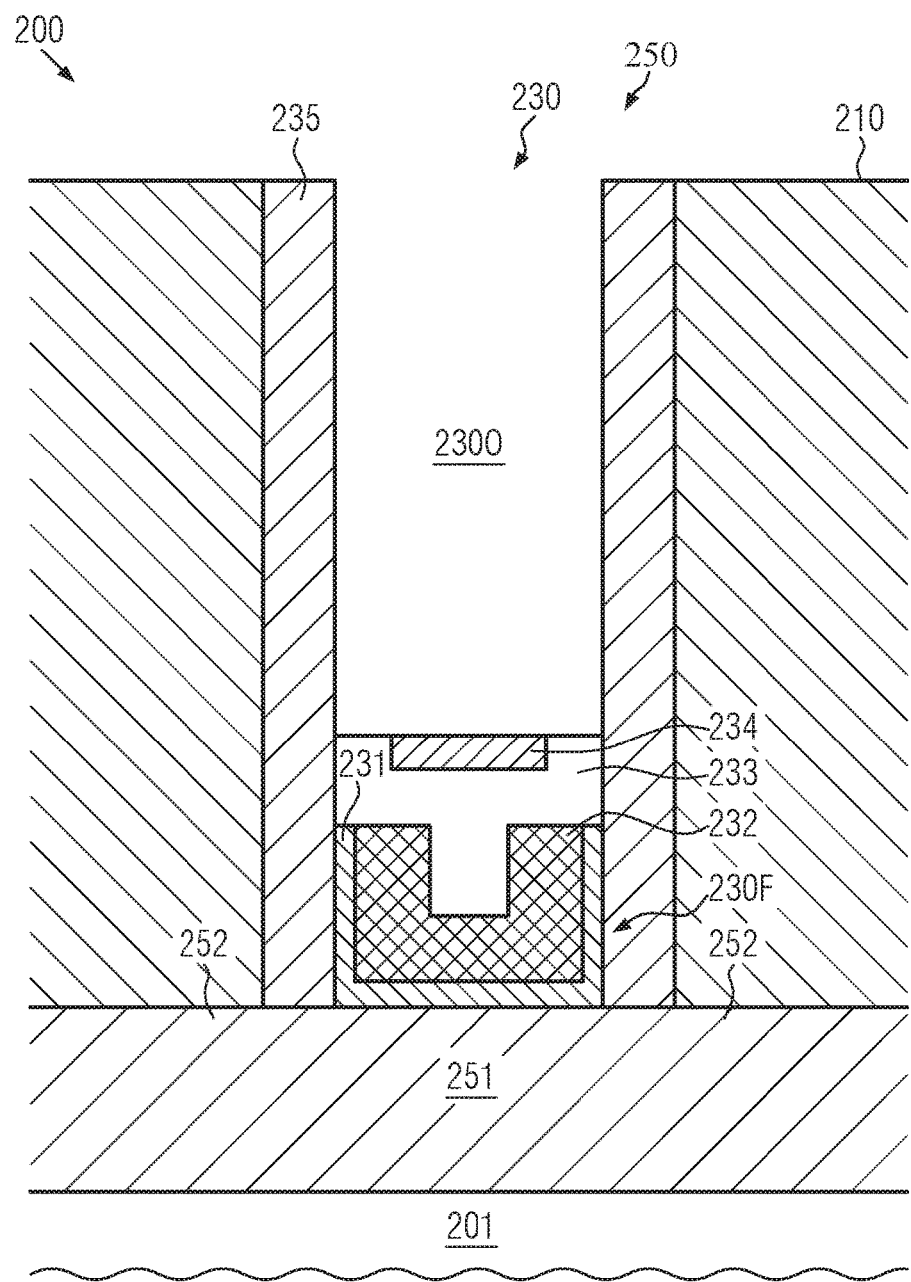
FIGS. 2A-2F schematically illustrate cross-sectional views of a semiconductor device during various manufacturing stages in forming a gate electrode structure, including a floating gate electrode portion and a negative capacitor portion, by using a dielectric spacer and a specific deposition for filling the remaining opening, according to further illustrative embodiments.

FIG. 2A schematically illustrates a cross-sectional view of a semiconductor device 200 which may comprise a transistor element 250 formed on the basis of a gate electrode structure 230. With respect to the transistor element 250, the same criteria may apply as previously discussed in the context of the transistor element 150. Therefore, any further discussion of any details of materials, processes and the like may be omitted and reference may be made to the semiconductor device 100 described in the context of FIG. 1A. Similarly, the gate electrode structure 230 may have a configuration as also discussed above in the context of the gate electrode structure 130 of FIG. 1A. That is, the gate electrode structure 230 may comprise a dielectric material 231, such as a high-k dielectric material, possibly in combination with a conventional dielectric material (not shown), followed by a work function-adjusting material 232, a barrier material 233 and an electrode material 234. For any of these materials, the same criteria may apply as previously discussed in the context of the gate electrode structure 130 of FIG. 1A. Moreover, an opening 230O may be formed on the basis of sidewall spacers 235, as also previously discussed in the context of the semiconductor device 100.

With respect to manufacturing strategies for forming the semiconductor device 200, reference may be made to the processes and material systems previously described in the context of the semiconductor device 100.

Figure 2B:
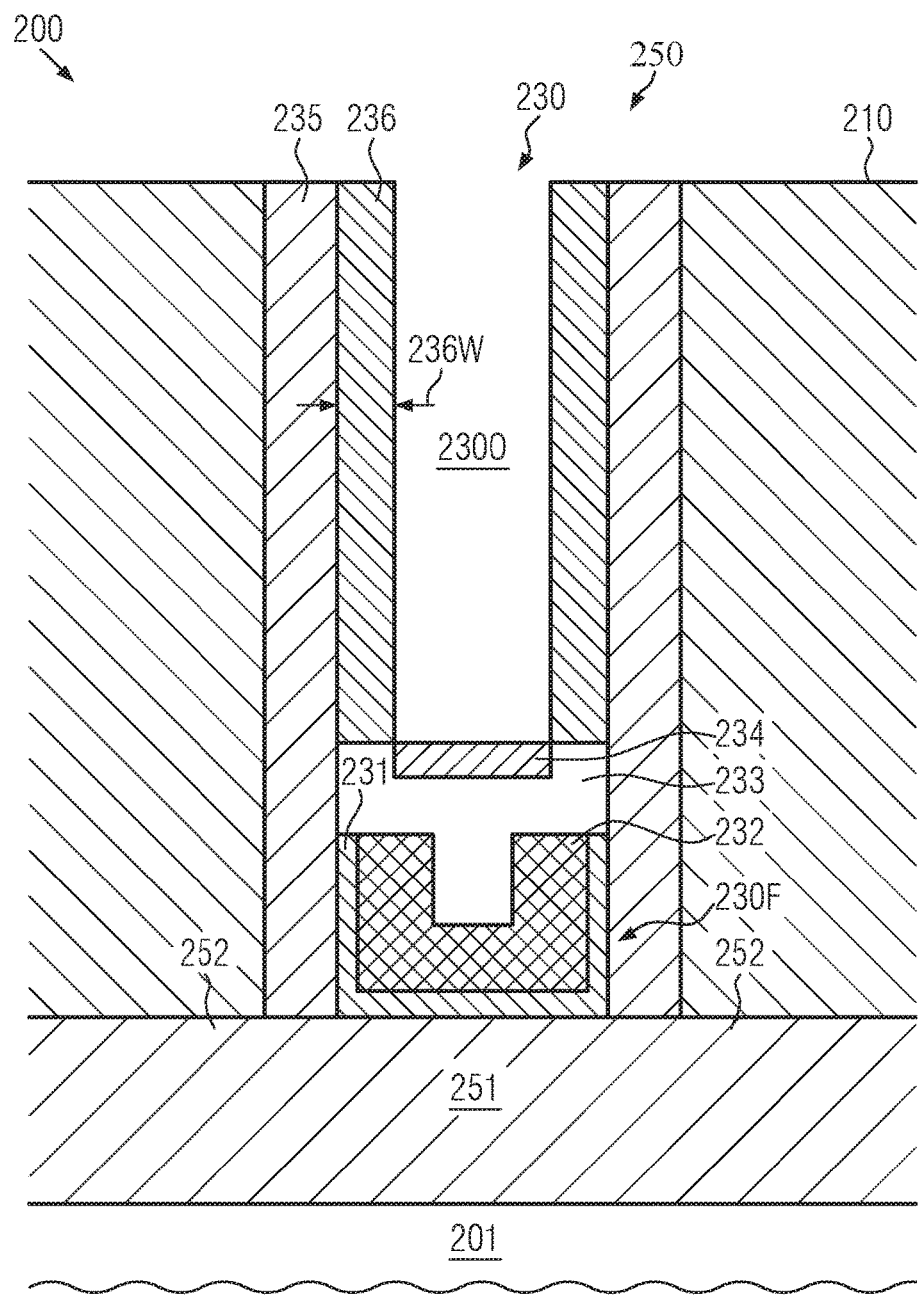

FIG. 2B schematically illustrates the semiconductor device 200 after forming dielectric sidewall spacers 236, for example, low-k dielectric spacers based on materials as specified above, within the opening 230O, wherein the sidewall spacers 236 may be formed on the basis of similar materials and process techniques as described in the context of the sidewall spacers 136 of FIG. 1B. In particular, the spacers 236 may be formed on the basis of a desired target thickness or width 236W, which may be accomplished by applying well-established deposition techniques, as also discussed above.

Figure 2C:
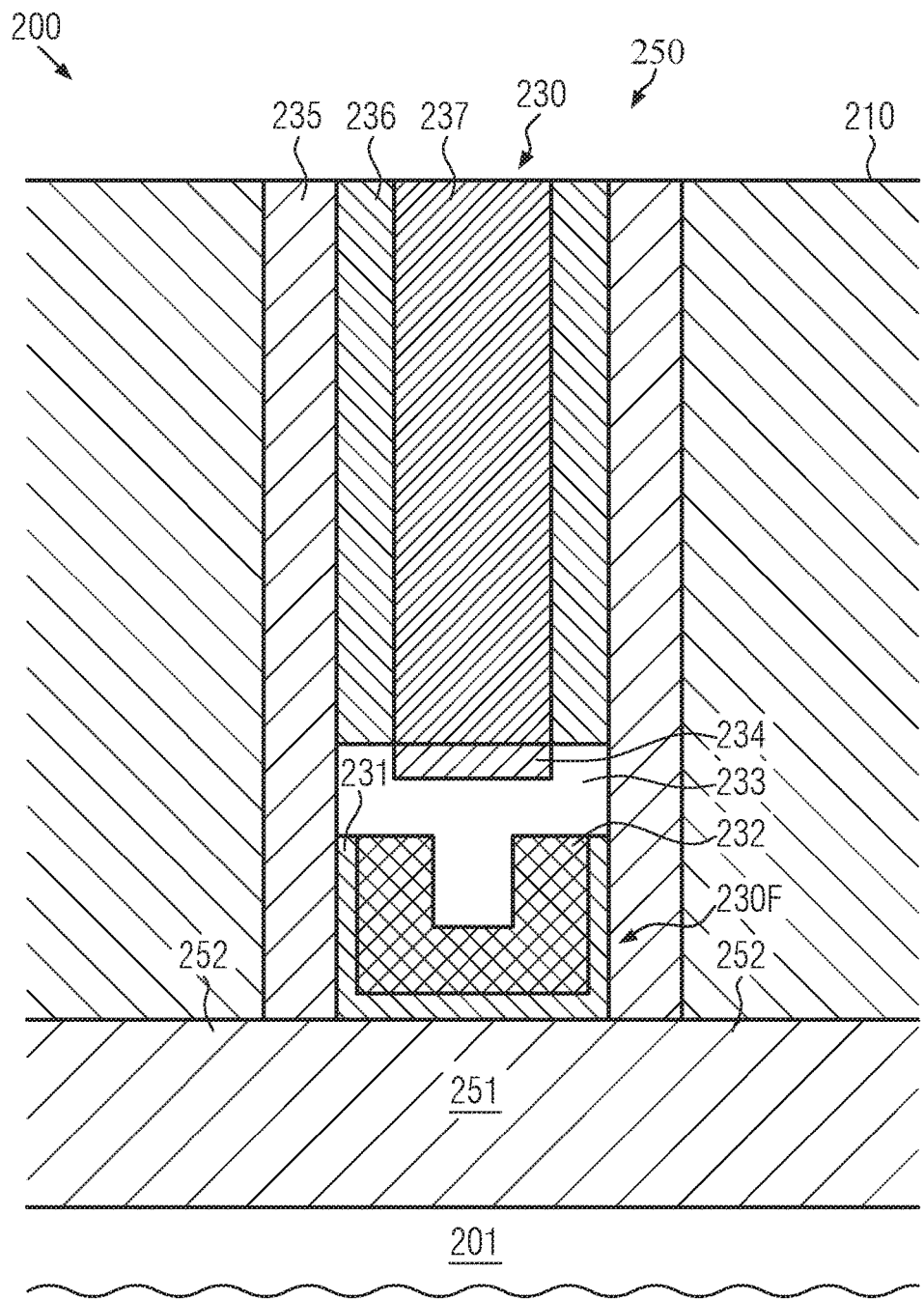

FIG. 2C schematically illustrates the semiconductor device 200 in a further advanced manufacturing stage. As illustrated, the opening 230O (see FIG. 2B) may be filled with a dielectric material 237, which may also exhibit ferroelectric characteristics, as also previously discussed. For example, the dielectric material 237 may have a material composition similar to that of the sidewall spacers 236, while, in other cases, any other appropriate high-k dielectric material may be used, as long as a ferroelectric behavior may be achieved, for instance, after applying appropriate pre- and/or post-deposition treatments. The material 237, such as hafnium dioxide, zirconium dioxide, hafnium zirconium dioxide and the like, may be deposited on the basis of appropriate deposition techniques, wherein the deposition parameters are appropriately selected so as to substantially completely fill the opening 230O (see FIG. 2B). To this end, a respective number of cycles of an ALD process sequence may be used or other CVD recipes may be applied in order to obtain a desired fill behavior during the deposition of the material 237. If required, any excess material may be removed, for instance, by a planarization process or by an etch process, wherein a well-defined surface topography may result in superior process control during the subsequent removal process for removing at least a portion of the material 237.

Figure 2D:
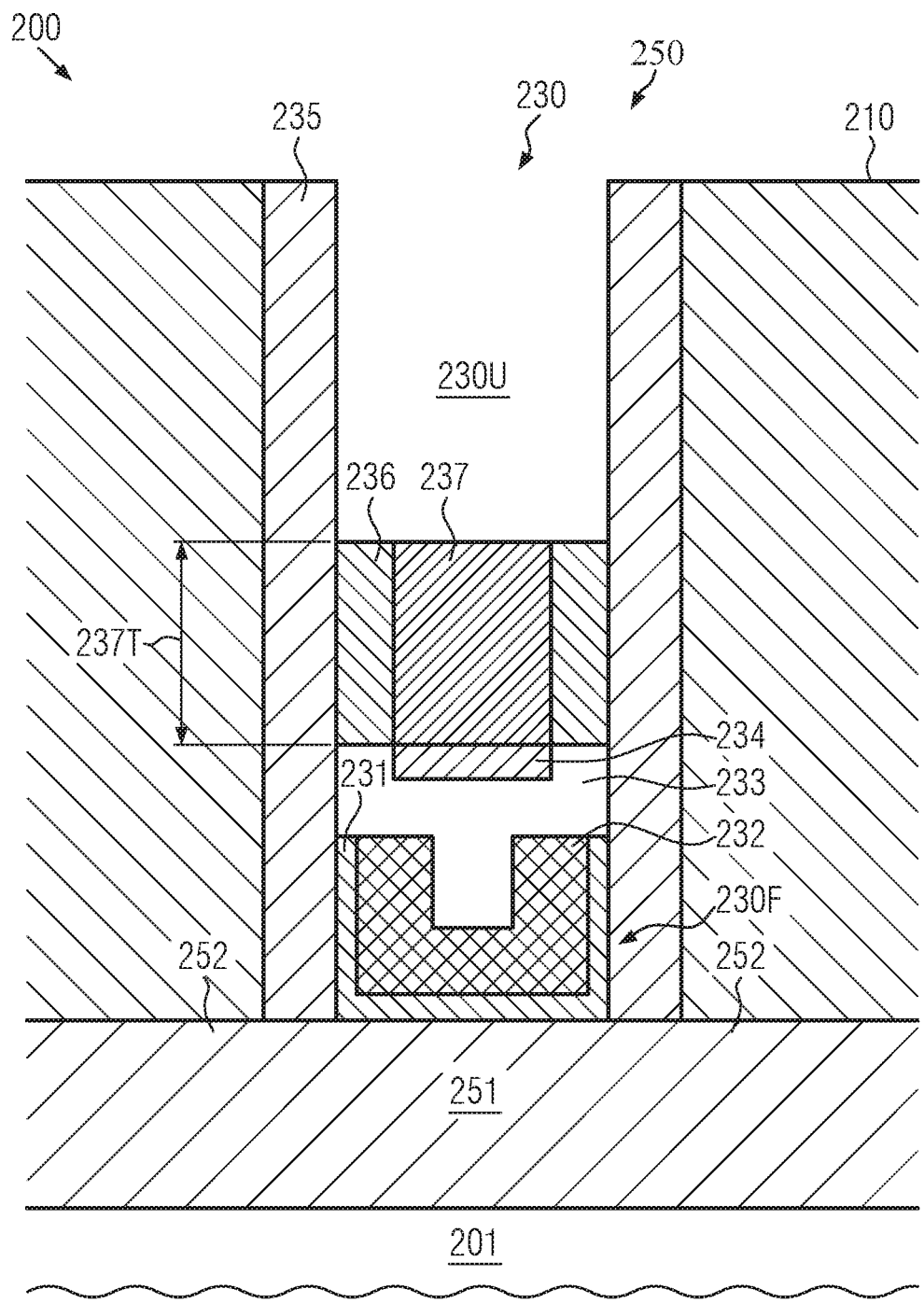

FIG. 2D schematically illustrates the semiconductor device 200 after forming an opening 230U by removing at least a portion of the material 237. In the embodiment shown, the material 236 may also be removed. It should be appreciated that a plurality of selective etch recipes for removing hafnium dioxide-based materials may be available and may be advantageously used for selectively removing at least the material 237 with respect to the spacers 235. During the etch process, at least one etch parameter, such as etch time, may be appropriately controlled so as to obtain a residual thickness 237T of the material 237, which may, thus, enable fine-tuning of the resulting negative capacitance on the basis of the thickness of the dielectric material 237.

As also previously discussed, in some illustrative embodiments, the spacer 236 may be provided in the form of a material which may not undergo a further substantial transformation in material characteristics when a respective post-deposition treatment of the dielectric material 237 may be required in order to adjust the desired ferroelectric behavior thereof. That is, in some illustrative embodiments, the material of the spacer 236 may have significantly different characteristics, for instance, a substantially reduced dielectric constant, in order to not significantly affect the overall capacitive coupling to the floating gate electrode portion 230F. In other cases, as discussed above, only the material 237 may be reduced in thickness, and the spacer 236 may be substantially preserved within the opening 230U.

Figure 2E:
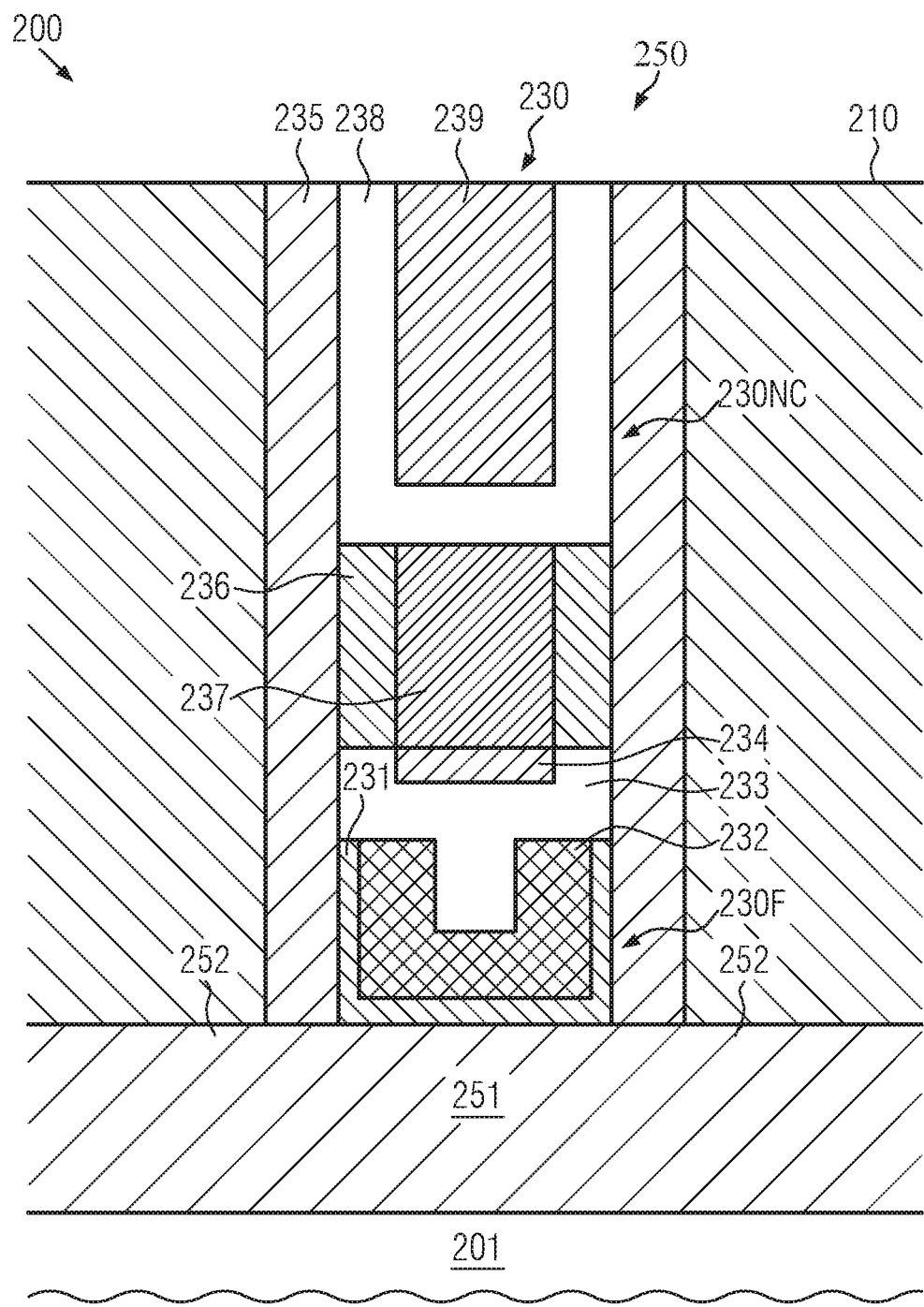

FIG. 2E schematically illustrates the semiconductor device 200 in a further advanced manufacturing stage in which appropriate electrode materials in the form of an appropriate barrier material 238, such as titanium nitride and the like, and a highly conductive metal 239, such as tungsten, may be formed so as to connect to the dielectric material 237. With respect to forming the materials 238, 239, similar techniques may be used as previously discussed with reference to the semiconductor device 100. That is, layers of the materials 238, 239 may be deposited on the basis of well-established techniques, and a planarization process, such as a chemical mechanical polishing process, may be applied in order to obtain a planar surface topography. Consequently, a negative capacitor portion 230NC may be obtained on the basis of the materials 238, 239 acting as an electrode and the dielectric material 237 acting as a capacitor dielectric. As discussed above, the dielectric sidewall spacer 236 may also have a certain influence on the finally obtained capacitive coupling, however, in some illustrative embodiments, with a significantly reduced degree compared to the central portion formed by the material 237.

Figure 2F:
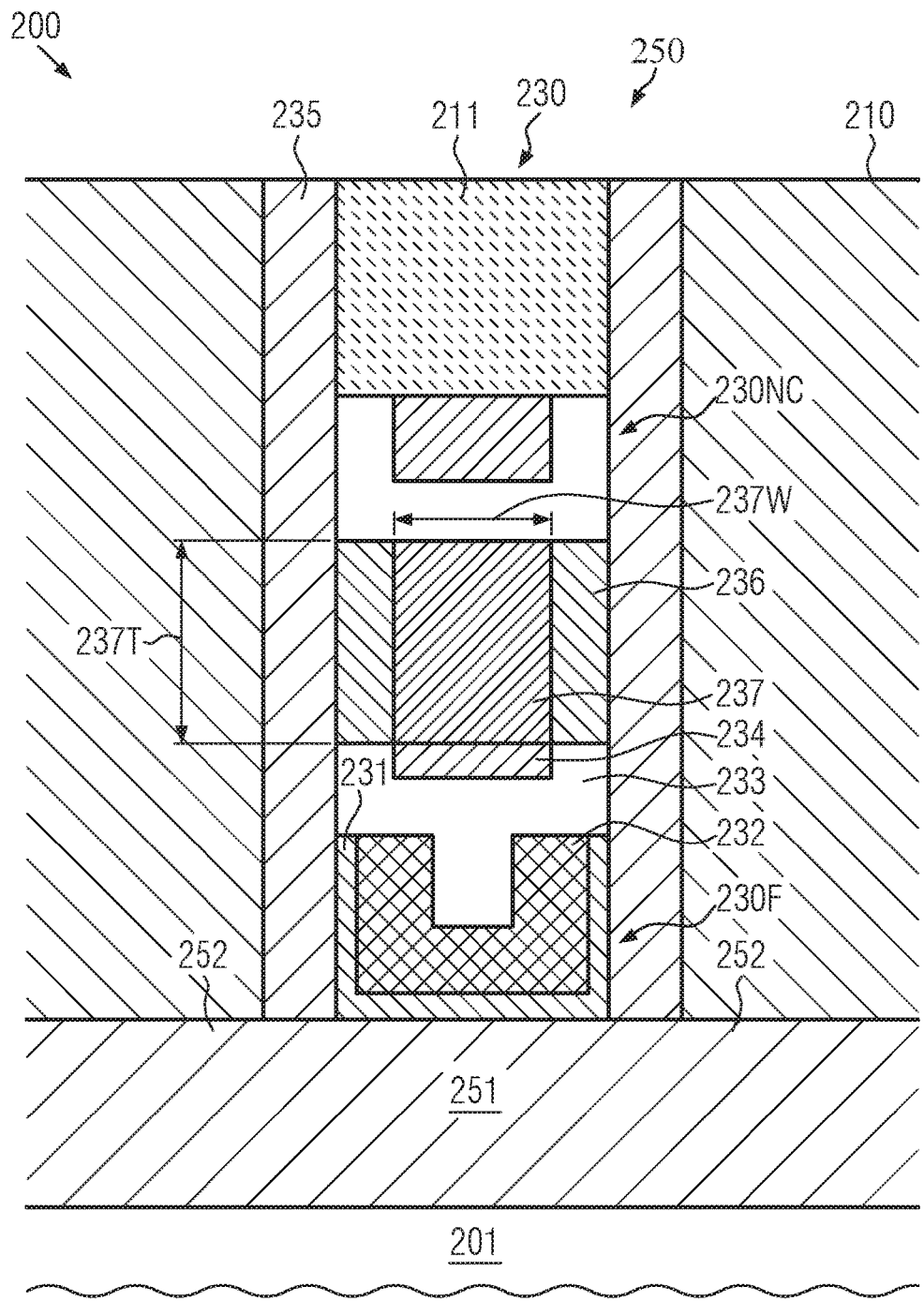

FIG. 2F schematically illustrates the semiconductor device 200 in a further advanced manufacturing stage. As shown, a dielectric cap material 211 may be formed in the gate electrode structure 230 so as to provide the capability of forming self-aligned contact elements, as previously discussed. To this end, well-established process strategies may be applied, as also discussed above.

Furthermore, the ferroelectric characteristics of the material 237 may be established by annealing at any appropriate point of the process flow, such as in a stage as shown in FIG. 2F. Any non-crystallized portions of the material 237 that may still be present in any surface areas may be efficiently removed by CMP.

As a consequence, the gate electrode 230 may comprise the negative capacitor portion 230NC with its dielectric material 237, in illustrative embodiments comprising a ferroelectric material, having a specified thickness 237T, the value of which may be appropriately adjusted on the basis of the process of forming the opening 230U (see FIG. 2D). That is, the thickness 237T may be defined by a well-controllable etch process, thereby ensuring low variations of the finally obtained negative capacitance of the portion 230NC. Furthermore, the effective capacitive area may be defined by the measure 237 W, i.e., by the width of the material 237, whereas the influence of the dielectric sidewall spacer 236 may be significantly reduced or may be negligible, for instance, by selecting an appropriate dielectric material of relatively low dielectric constant. The width 237W may, thus, be defined on the basis of a well-controllable deposition process for forming the spacer 236 of specified width 236W, as previously discussed (FIG. 2B). Therefore, also in this case, a well-defined negative capacitance may be obtained for the portion 230NC for a given overall configuration of the floating gate electrode portion 230F. Also in this case, the advantages discussed above in the context of the device 100 may be achieved with a high degree of compatibility to well-established process strategies.

With reference to FIGS. 3A-3E, further illustrative embodiments will now be described in more detail, in which, in particular, a respective effective capacitive area may be adjusted on the basis of a conductive sidewall spacer.

Figure 3A:
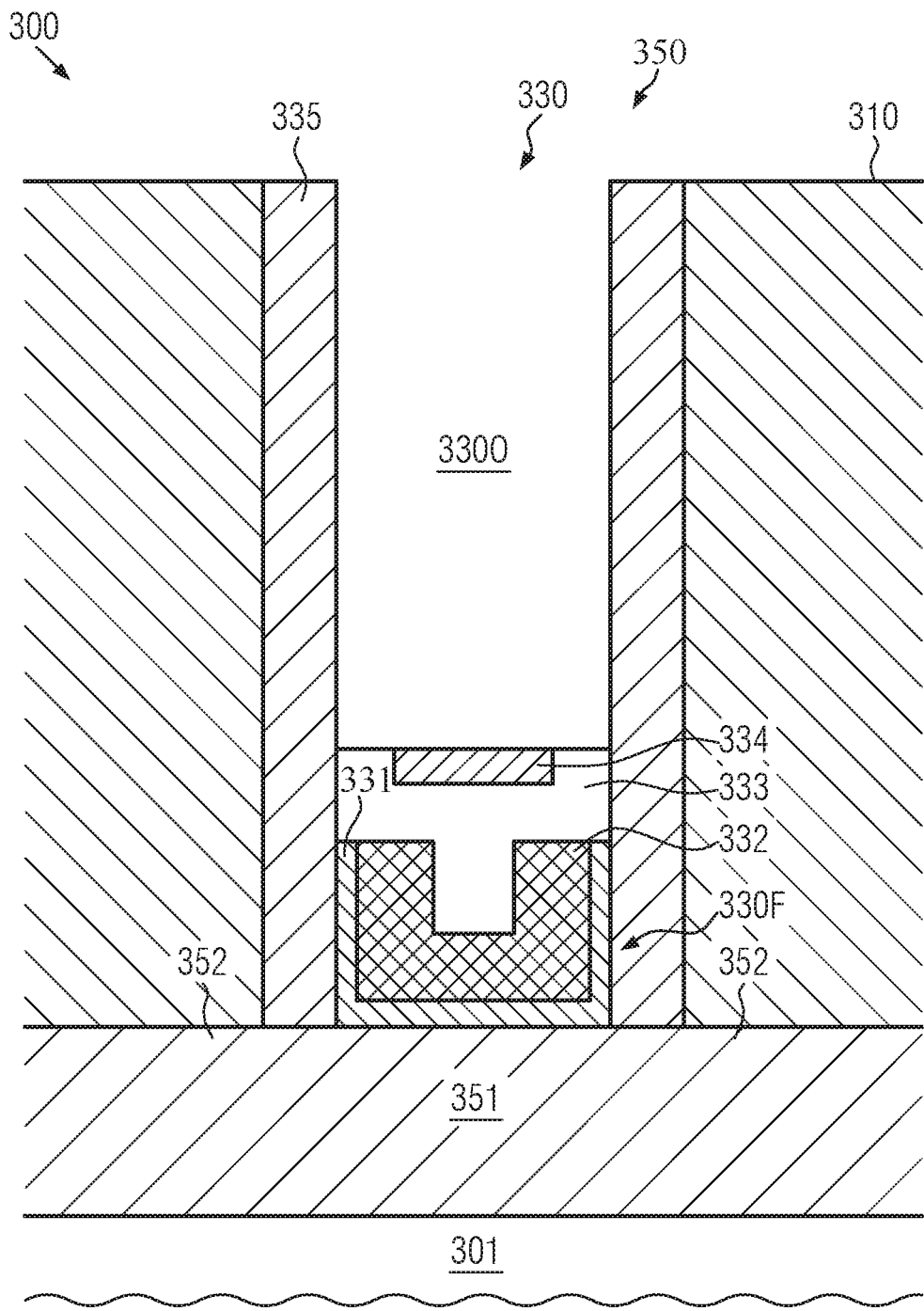
FIGS. 3A-3E schematically illustrate cross-sectional views of a semiconductor device during various manufacturing stages, wherein, in particular, the effective capacitive area may be adjusted on the basis of a conductive sidewall spacer for defining the effective area of the electrode material of the floating gate electrode portion prior to forming the dielectric material, such as a ferroelectric material of the negative capacitor portion, according to still further illustrative embodiments.

FIG. 3A schematically illustrates a semiconductor device 300 comprising a transistor element 350, which, in turn, may comprise a gate electrode structure 330. With respect to the semiconductor device 300 and the transistor element 350, the same criteria may apply as previously discussed in the context of the semiconductor devices 100 and 200. Therefore, any specific details of the semiconductor device 300 and the transistor element 350, which may not be related to the gate electrode structure 330, will not be repeated. In this respect, reference may be made to the details provided in the context of the semiconductor devices 100 and 200.

Similarly, the gate electrode structure 330 in this manufacturing stage may have a configuration similar to that previously discussed in the context of the gate electrode structure 130 of FIG. 1A and the gate electrode structure 230 of FIG. 2A. That is, the gate electrode structure 330 may comprise a gate dielectric material 331, a work function material 332, a barrier material 333 and a highly conductive electrode material 334. Furthermore, an opening 330O may be formed so as to expose the conductive materials 333 and 334, while sidewalls of the openings 330O may be defined by sidewall spacers 335. Also in this case, for any further details with respect to materials, process techniques for forming the gate electrode structure 330 and the like, the same criteria may apply as previously discussed in the context of the gate electrode structures 130, 230.

Figure 3B:
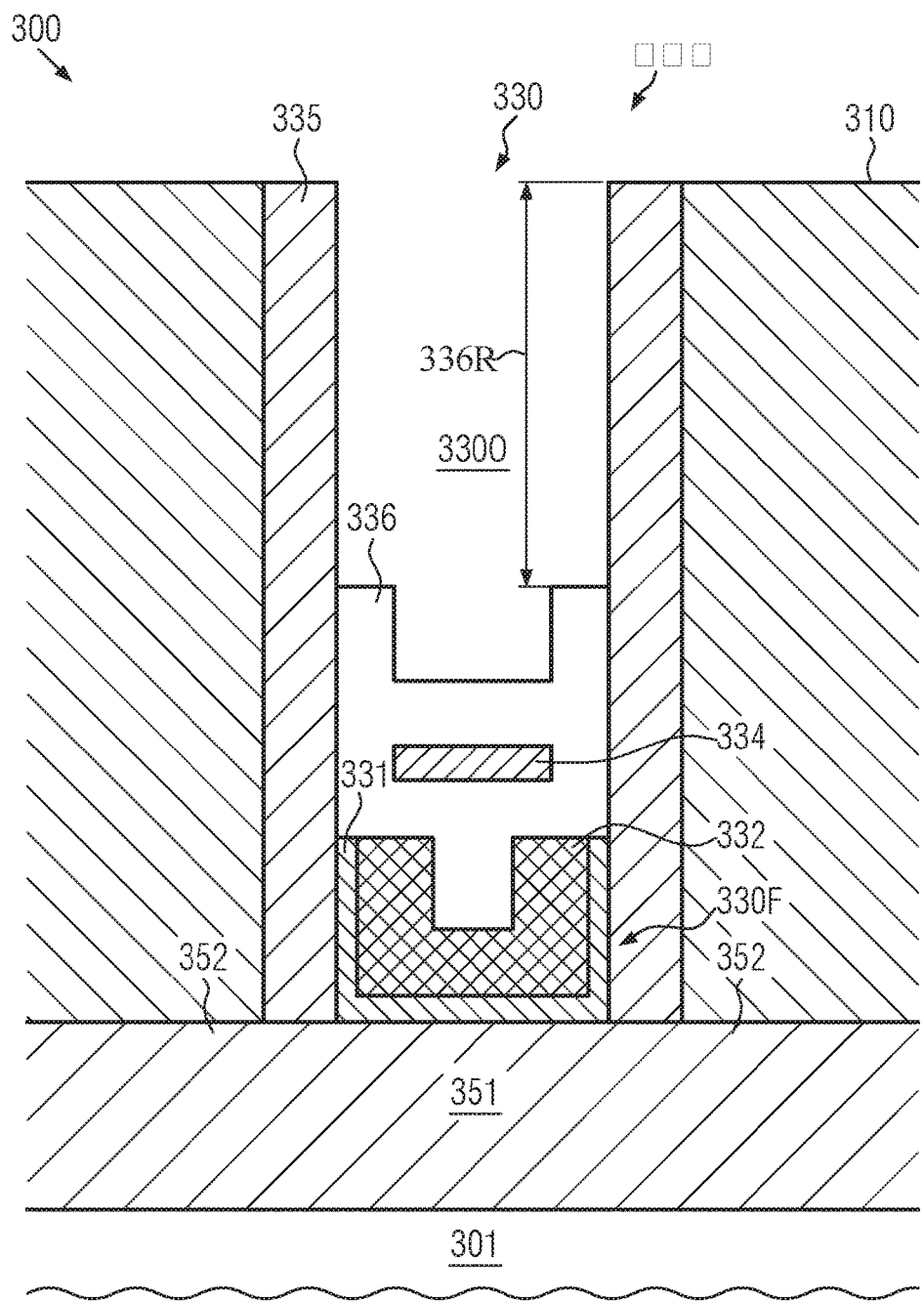

FIG. 3B schematically illustrates the semiconductor device 300 in a further advanced manufacturing stage. As illustrated, a conductive material 336, such as titanium nitride, tantalum nitride and the like, may be formed at least on a portion of sidewalls of the opening 330O, i.e., on a portion of the surface areas of the spacers 335. To this end, any appropriate deposition recipe may be applied so as to form a layer of the material 336 with well-defined thickness within the opening 330O, for which well-established deposition recipes are available. Thereafter, a portion of the material 336 may be removed, for instance, by any appropriate selective anisotropic etch recipe, thereby obtaining a specific degree of recessing 336R, which may, thus, represent a mechanism for controlling the negative capacitance, as will be described later on in more detail.

It should be appreciated that in the corresponding process strategy, the material 336 may be removed from above the electrode material 334, if this material 334 provides sufficient etch selectivity in order to act as an efficient etch stop layer. In other cases, the required recessing 336R may be accomplished on the basis of other appropriate etch recipes in which, for instance, an appropriate polymer material may be deposited so as to reliably fill the opening 330O, while still providing a substantially planar surface topography. In a subsequent etch process, the previously formed planarization layer may be removed together with exposed portions of the material 336, until the target recessing 336R may be achieved. Thereafter, the planarization layer may be removed by any appropriate removal process, such as plasma ashing and the like. In this case, the material 336 having the respective layer thickness may still be present on top of the electrode material 334, as shown in FIG. 3B.

Figure 3C:
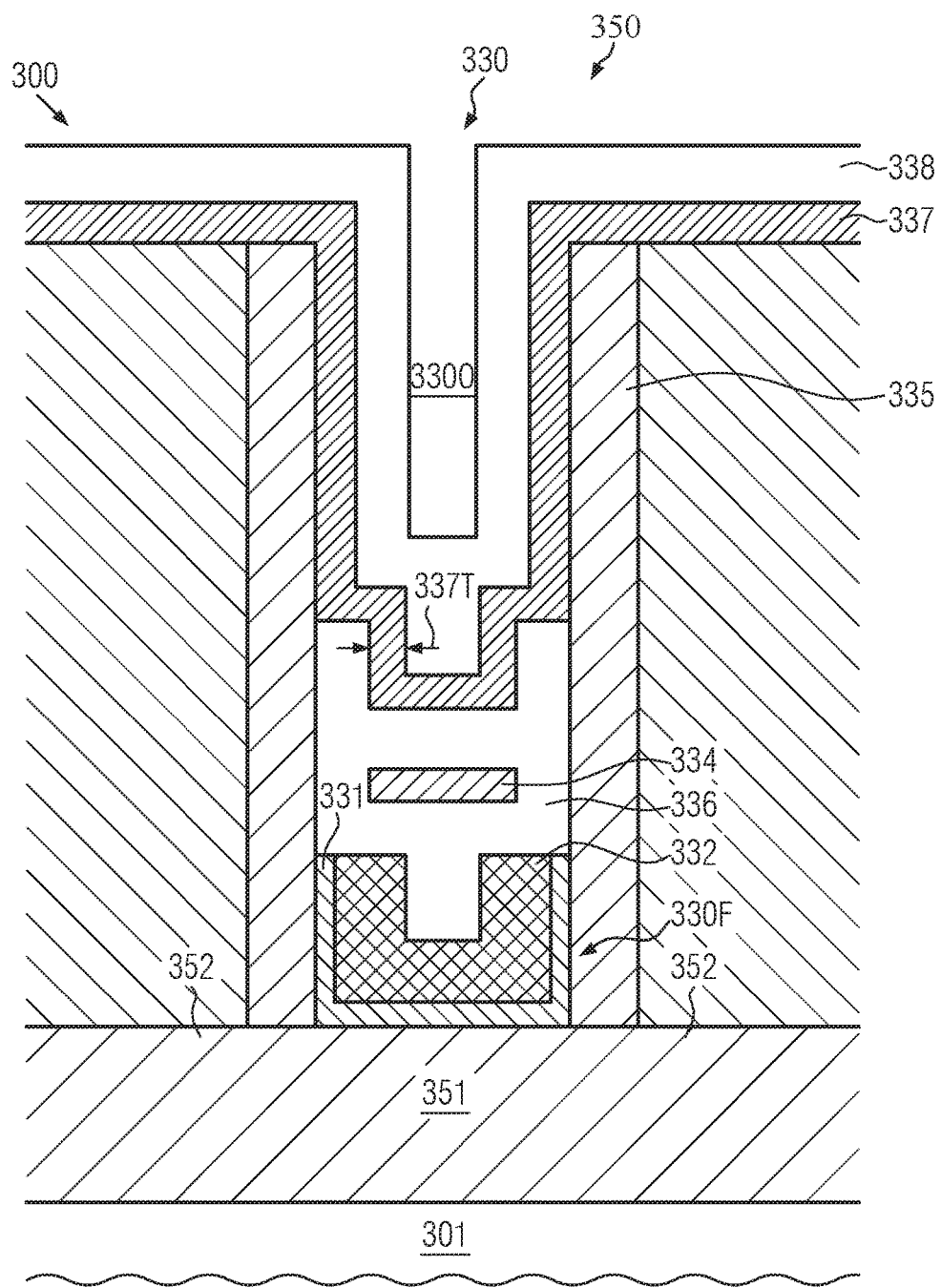

FIG. 3C schematically illustrates the semiconductor device 300 in a further advanced manufacturing stage. As shown, a layer of dielectric material 337 having the capability of exhibiting ferroelectric characteristics may be conformally formed within the opening 330O so that a specified layer thickness 337T may be provided in contact with the conductive sidewall spacer 336 and a material of the layer 336 or the material 334, as discussed above, at the bottom of the previously formed opening 330O. Furthermore, an appropriate conductive material 338, such as titanium nitride, tantalum nitride and the like, may be formed in a conformal manner on the dielectric layer 337. Also in this case, well-established deposition techniques are available, wherein, in particular, the thickness 337T may be adjusted with a high degree of precision on the basis of an appropriately selected target value by using sophisticated deposition techniques, such as ALD and the like. Thereafter, well-established deposition techniques may be applied for forming the conductive layer 338.

Figure 3D:
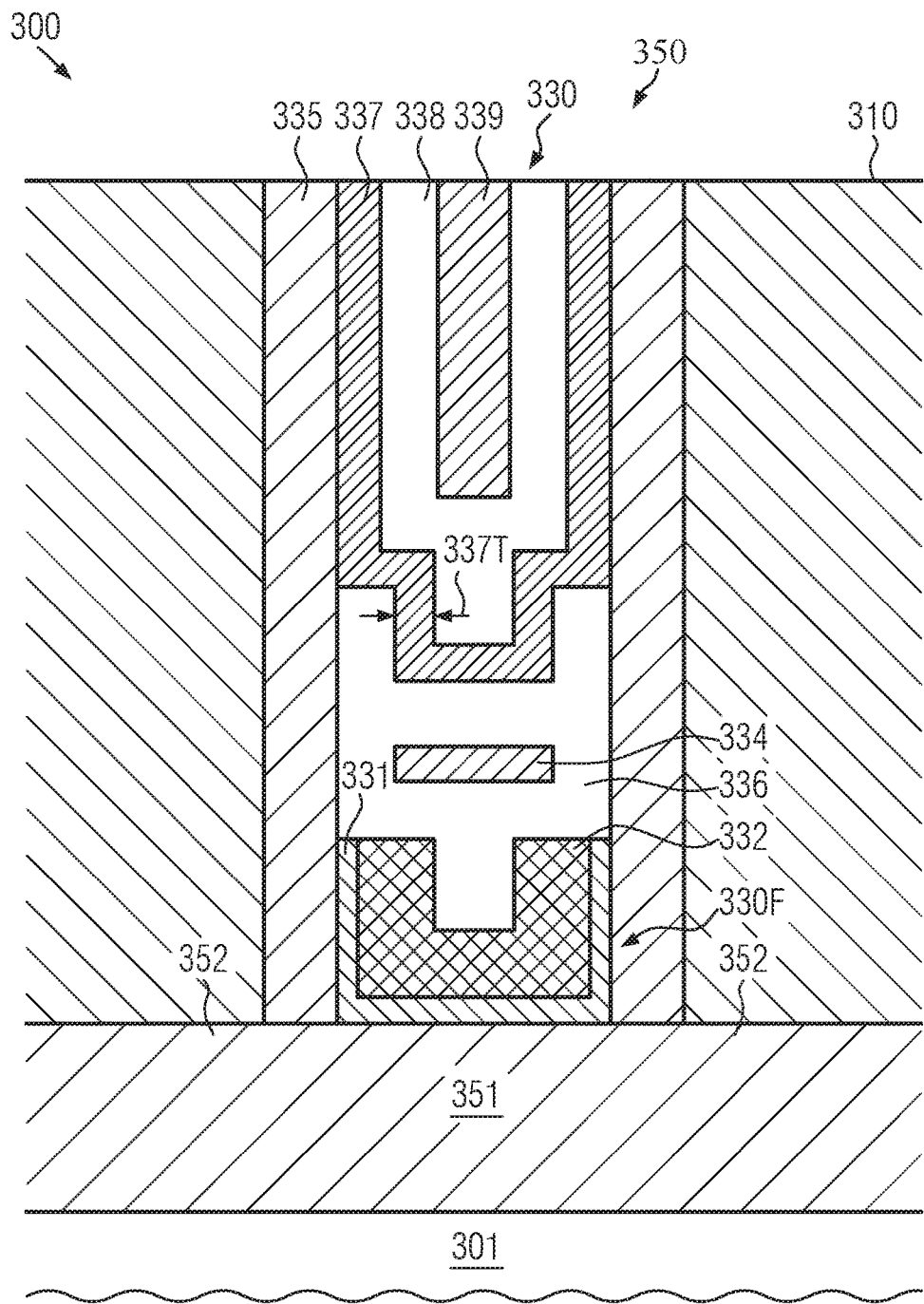

FIG. 3D schematically illustrates the semiconductor device 300 after filling the opening 330O (see FIG. 3C) with a highly conductive electrode material 339, such as tungsten and the like. To this end, well-established deposition techniques may be applied, followed by a planarization process in order to obtain a planar surface topography.

Figure 3E:
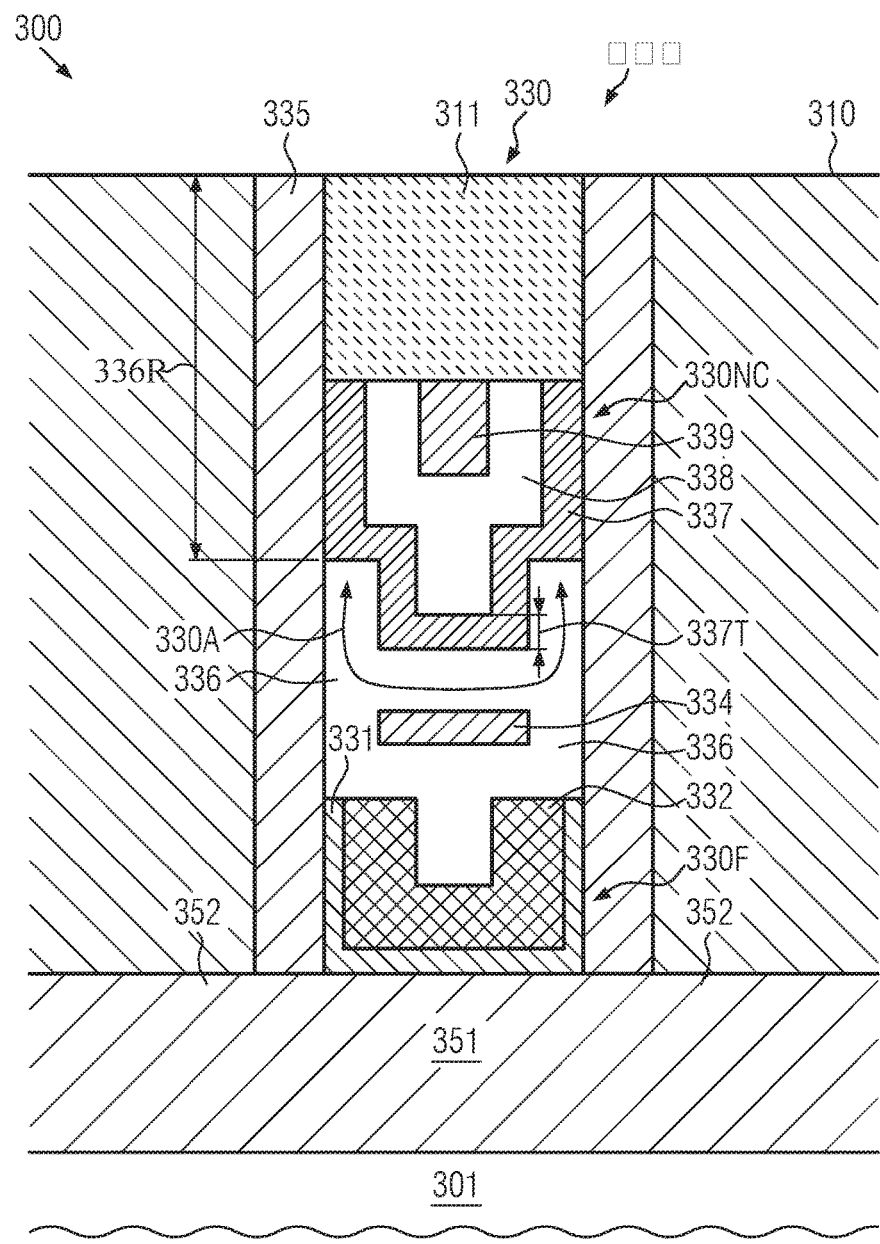

FIG. 3E schematically illustrates the semiconductor device 300 in a further advanced manufacturing stage. As illustrated, a portion of the materials 337, 338, 339 may be replaced by a dielectric cap material 311 provided for enabling a self-aligned contact process, as also discussed above with reference to the semiconductor devices 100, 200. To this end, well-established process techniques may be applied.

Furthermore, as also discussed above, the characteristics of the material 337 with respect to the degree of ferroelectricity may be adjusted on the basis of selecting appropriate deposition conditions and/or applying pre- and/or post-deposition treatments, such as anneal processes, modulation of surface potential of the material 336, and the like. For example, annealing the material 337 may be performed at a stage as shown in FIG. 3E, thereby simplifying the recessing of the materials 337, 338 and 339, as described above.

As a consequence, the gate electrode structure 330 may comprise a floating gate electrode portion 330F including the highly conductive electrode material 334 and the conductive material 336, which may also be referred to as a conductive sidewall spacer that, to a certain degree, is wrapped around the dielectric material 337 having the desired thickness 337T.

Thus, the gate electrode 330 may comprise a negative capacitor portion 330NC formed by the conductive materials 338 and 339 as electrode and the dielectric material 337, for instance in the form of a ferroelectric material. Consequently, the capacitive coupling is determined by an effective capacitive area 330A, defined by the conductive sidewall spacers 336 and, of course, the bottom material, which may also be presented in the form of material 336 as shown in FIG. 3E, or which may be provided in the form of the material 334, as previously discussed, when the bottom portion of the material 336 has been removed during forming the recessing 336R. Consequently, the degree of recessing 336R may, therefore, define the size of the area 330A, thereby enabling adjustment of the area 330A on the basis of a process sequence applied for recessing the conductive sidewall spacers 336. On the other hand, for given material characteristics, defined by material composition and type of treatment, the negative capacitance is also defined by the thickness 337T, which may be independently adjusted on the basis of selecting appropriate deposition parameters upon forming the dielectric layer 337. Therefore, a desired fine-tuning of the resulting negative capacitance of the portion 330NC may be accomplished by controlling the degree of recessing 336R and/or controlling the thickness 337T. For instance, when the degree of recessing 336R is reduced, for instance, by appropriately controlling a respective etch time, the area 330A may be increased, thereby also increasing the amount of the negative capacitance.

As a result, the present disclosure provides manufacturing strategies and resulting semiconductor devices in which a gate electrode structure of a transistor element may be provided as a series connection of a negative capacitor portion and a floating electrode portion.

To this end, the value of a negative capacitance of the gate electrode structure may be adjusted in a precise manner by providing at least two different mechanisms, i.e., manufacturing process sequences, in order to adjust layer thickness of a ferroelectric material and effective capacitive area of the dielectric material, wherein the layer thickness and effective area are determined by the material characteristics, such as dielectric constant and the like, which in turn depend on the selection of the material composition and its treatment, i.e., annealing. Therefore, a desired matching of the positive capacitance of the actual gate electrode structure, i.e., the floating electrode portion of the gate electrode structure, and of the negative capacitor portion may be accomplished in order to obtain superior transistor performance with respect to reduced sub-threshold swing, increased on-current for a given supply voltage, while avoiding hysteresis in the gate voltage/on-current characteristic. Therefore, for a given overall transistor configuration and for a given supply voltage, reduced leakage currents and superior switching characteristics may be achieved, or for a given transistor performance, generally the supply voltage may be reduced, thereby also contributing to reduced overall power consumption in sophisticated semiconductor devices. The techniques described herein may, therefore, be efficiently applied to strategies in which the final gate electrode characteristics are implemented after having embedded the transistors into an interlayer dielectric material of a contact level. In some approaches, the essential gate electrode materials, such as a portion of the gate dielectric material, the work function material and a highly conductive electrode material, may be provided in a late manufacturing stage, while, in other cases, at least some of these materials may be provided in an early manufacturing stage, i.e., prior to completing the basic transistor configuration.

The particular embodiments disclosed above are illustrative only, as the subject matter defined by the appended claims may be modified and practiced in different but equivalent manners apparent to those skilled in the art having the benefit of the teachings herein. For example, some or all of the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed subject matter. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
   a gate electrode structure positioned adjacent to a channel region of a transistor element, said gate electrode structure comprising:
   a floating gate electrode portion;
   a negative capacitor portion;
   a ferroelectric material capacitively coupling said floating gate electrode portion to said negative capacitor portion;
   a first conductive material positioned between said floating gate electrode portion and said ferroelectric material, wherein a first portion of said first conductive material is embedded in and laterally surrounded by said floating gate electrode portion; and
   a second conductive material positioned between said first portion of said first conductive material and said ferroelectric material, wherein said second conductive material is embedded in and laterally surrounded by a second portion of said first conductive material.

2. The semiconductor device of claim 1, wherein said first conductive material is different from said second conductive material.

3. The semiconductor device of claim 1, wherein said gate electrode structure further comprises a dielectric sidewall spacer element laterally surrounding said ferroelectric material, said dielectric sidewall spacer element having a bottom surface that covers a top surface of said second portion of said first conductive material.

4. The semiconductor device of claim 1, wherein a portion of said ferroelectric material is laterally surrounded by a third portion of said first conductive material.

5. The semiconductor device of claim 1, wherein an upper surface of said first conductive material is substantially co-planar with an upper surface of said second conductive material.

6. The semiconductor device of claim 1, wherein an upper surface of said second conductive material is covered by a third portion of said first conductive material.

7. The semiconductor device of claim 1, further comprising a third conductive material that is embedded in and laterally surrounded by said ferroelectric material.

8. The semiconductor device of claim 7, wherein said third conductive material comprises said negative capacitor portion.

9. The semiconductor device of claim 8, wherein said negative capacitor portion further comprises a fourth conductive material that is embedded in and laterally surrounded by said third conductive material.

10. The semiconductor device of claim 9, wherein said third conductive material is different from said fourth conductive material.

11. The semiconductor device of claim 1, wherein said negative capacitor portion further comprises:
a third conductive material; and
a fourth conductive material that is embedded in and laterally surrounded by said third conductive material.

12. The semiconductor device of claim 11, wherein an upper surface of said third conductive material is substantially co-planar with an upper surface of said fourth conductive material.

13. A semiconductor device, comprising:
a gate electrode structure positioned adjacent to a channel region of a transistor element, said gate electrode structure comprising:
a floating gate electrode portion;
a negative capacitor portion comprising a first conductive material and a second conductive material that is different from said first conductive material, wherein said second conductive material is embedded in and laterally surrounded by said first conductive material;
a ferroelectric material capacitively coupling said floating gate electrode portion to said negative capacitor portion, wherein at least a portion of said ferroelectric material is laterally surrounded by a dielectric sidewall spacer;
a third conductive material positioned between said floating gate electrode portion and said ferroelectric material, wherein a first portion of said third conductive material is embedded in and laterally surrounded by said floating gate electrode portion; and
a fourth conductive material positioned between said first portion of said third conductive material and said ferroelectric material, wherein said fourth conductive material is embedded in and laterally surrounded by a second portion of said third conductive material, said fourth conductive material being different from said third conductive material.

14. The semiconductor device of claim 13, wherein a portion of said first conductive material is embedded in and laterally surrounded by said ferroelectric material.

15. The semiconductor device of claim 13, wherein a portion of said ferroelectric material is embedded in and laterally surrounded by said third conductive material.

16. The semiconductor device of claim 13, wherein an upper surface of said third conductive material is substantially co-planar with an upper surface of said fourth conductive material.

17. The semiconductor device of claim 13, wherein an upper surface of said fourth conductive material is covered by a third portion of said third conductive material.

18. The semiconductor device of claim 13, wherein a bottom surface of said dielectric sidewall spacer covers at least part of a top surface of said second portion of said third conductive material.

19. The semiconductor device of claim 13, wherein said floating gate electrode portion comprises a gate dielectric material layer and a work-function adjusting material that is embedded in and laterally surrounded by said gate dielectric material layer, wherein said first portion of said third conductive material is embedded in and laterally surrounded by said work-function adjusting material.

20. A semiconductor device, comprising:
a gate electrode structure positioned adjacent to a channel region of a transistor element, said gate electrode structure comprising:
a floating gate electrode portion;
a negative capacitor portion comprising a first conductive material and a second conductive material, wherein said second conductive material is embedded in and laterally surrounded by a first portion of said first conductive material;
a ferroelectric material capacitively coupling said floating gate electrode portion to said negative capacitor portion, wherein said first conductive material is embedded in and laterally surrounded by said ferroelectric material;
a third conductive material positioned between said floating gate electrode portion and said ferroelectric material, wherein a first portion of said third conductive material is embedded in and laterally surrounded by said floating gate electrode portion, and wherein a lower portion of said ferroelectric material is embedded in and laterally surrounded by a second portion of said third conductive material; and
a fourth conductive material positioned between said first portion of said third conductive material and said ferroelectric material, wherein said fourth conductive material is embedded in and laterally surrounded by a third portion of said third conductive material, said third portion of said third conductive material further covering an upper surface of said fourth conductive material; and
a dielectric sidewall spacer positioned adjacent to sidewalls of said gate electrode structure, said dielectric sidewall spacer laterally surrounding an upper portion of said ferroelectric material, said second and third portions of said third conductive material, and said floating gate electrode portion.

* * * * *